United States Patent
Ishiji et al.

(10) Patent No.: US 7,435,529 B2
(45) Date of Patent: *Oct. 14, 2008

(54) PHOTOSENSITIVE COMPOSITION AND IMAGE RECORDING METHOD USING THE SAME

(75) Inventors: Yohei Ishiji, Shizuoka (JP); Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 53 days.

This patent is subject to a terminal disclaimer.

(21) Appl. No.: 11/171,208

(22) Filed: Jul. 1, 2005

(65) Prior Publication Data

US 2006/0008733 A1 Jan. 12, 2006

(30) Foreign Application Priority Data

Jul. 6, 2004 (JP) ............................ P.2004-199101

(51) Int. Cl.
*G03F 7/00* (2006.01)
*G03F 7/004* (2006.01)

(52) U.S. Cl. .............................. 430/270.1; 430/270.15; 430/281.1; 430/905; 430/913; 430/302; 430/945

(58) Field of Classification Search ................ 430/302, 430/270.1, 905, 913, 270.15, 281.1
See application file for complete search history.

(56) References Cited

U.S. PATENT DOCUMENTS

| | | | |
|---|---|---|---|
| 2,850,445 A | | 9/1958 | Oster |
| 4,708,925 A | | 11/1987 | Newman |
| 6,140,384 A | * | 10/2000 | Sorori et al. ................. 522/12 |
| 6,335,144 B1 | * | 1/2002 | Murota et al. ............ 430/281.1 |
| 6,461,804 B1 | * | 10/2002 | Deroover ..................... 430/578 |
| 7,267,925 B2 | * | 9/2007 | Shibuya ................... 430/286.1 |

FOREIGN PATENT DOCUMENTS

| | | | |
|---|---|---|---|
| EP | 1048982 A1 | * | 11/2000 |
| EP | 1445120 A2 | * | 8/2004 |
| EP | 1 471 387 A2 | | 10/2004 |
| EP | 1 491 536 A1 | | 12/2004 |
| JP | 44-20189 B | | 8/1969 |
| JP | 8-276558 A | | 10/1996 |
| JP | 2002294093 A | * | 10/2002 |
| JP | 2004295012 A | * | 10/2004 |

OTHER PUBLICATIONS

English language abstract of JP 2004-295-12.*
XP-002339643—Derwent Publication Ltd. (2003)—Abstract of JP 2003 221517 A.
European Search Report dated Aug. 22, 2005.

* cited by examiner

*Primary Examiner*—Amanda C. Walke
(74) *Attorney, Agent, or Firm*—Sughrue Mion, PLLC

(57) ABSTRACT

A photosensitive composition comprising: a sensitizing dye represented by the formula (I) defined herein, in which Z represents a substituted divalent linking group forming a 5-membered or 6-membered ring, provided that a total volume of substituents arranged on the 5-membered or 6-membered ring formed by Z is 200 $Å^3$ or more; $R_1$ represents a hydrogen atom or a monovalent non-metal atomic group; A represents a substituted or unsubstituted aromatic ring or hetero ring; and $R_1$ and A may be taken together to form an aliphatic or aromatic ring; an activator compound being capable of causing a chemical change due to a mutual action with an electron excited state to be generated by light absorption of the sensitizing dye, thereby generating a radical or an acid; and a polymerizable compound being capable of reacting with at least one of a radical and an acid.

9 Claims, No Drawings

PHOTOSENSITIVE COMPOSITION AND IMAGE RECORDING METHOD USING THE SAME

FIELD OF THE INVENTION

The present invention relates to a photosensitive composition which can be applied to image forming materials such as three dimensional photofabrications, holographs, lithographic printing plate materials, color proofs, photoresists, and color filters, photocurable resin materials such as inks, paints, and adhesives, and so on and to an image recording method using the same. In particular, the invention relates to a photosensitive composition which is suitably used as a lithographic printing plate material capable of being subjected to direct plate making using various lasers from digital signals of a computer, etc. and to an image recording method using the same.

BACKGROUND OF THE INVENTION

With respect to solid lasers, semiconductor lasers and gas lasers capable of radiating ultraviolet light, visible light and infrared light having a wavelength of from 300 m to 1,200 nm, there have become easily available ones having a high output and a small size. These lasers are very useful as a recording light source during direct plate making from digital data from a computer, etc. With respect to recording materials which are sensitive to these various lasers, there have been made a variety of investigations. As representative examples thereof, there are known a number of recording materials such as materials which can be recorded with an infrared laser having a photosensitive wavelength of 760 nm or longer, including a positive working recording material as described in U.S. Pat. No. 4,708,925 and an acid catalyst crosslinking type negative working recording material as described in JP-A-8-276558; and recording materials adapting to ultraviolet light or visible light lasers of from 300 nm to 700 nm, including a radical polymerization type negative working recording material as described in U.S. Pat. No. 2,850,445 and JP-B-44-20189.

A problem which is common among all of these image forming materials resides in the matter that in the foregoing various energy-exposed areas and unexposed areas, how ON-OFF of the image can be enlarged, namely, how high sensitivity and storage stability of the image forming material are compatible with each other. Usually, a photo-radical polymerization system is of a high sensitivity, but polymerization hindrance due to oxygen in air is large so that the sensitivity is lowered. For that reason, there is employed a measure for providing an oxygen-blocking layer on an image forming layer. However, if the oxygen-blocking layer is provided, fog is inversely generated due to dark polymerization, etc. so that the storage stability is deteriorated. Accordingly, it is a difficult problem to make the high sensitivity and the storage stability compatible with each other, and thoroughly satisfactory results have not been obtained yet according to the conventional technologies. Thus, a new technology which had not been seen so far was demanded.

On the other hand, a high-sensitivity photoinitiator is described in and known by Bruce M. Monroe, et al., *Chemical Rev.*, 93, 435 (1993) and R. S. Davidson, et al., *Journal of Photochemistry and Biology*, 73, 81 (1993), etc.

SUMMARY OF THE INVENTION

Accordingly, in a photo-radical polymerization system composition which has the highest sensitivity and is promising in the image forming technology, an object of the invention is to provide a photosensitive composition which is imparted storage stability while keeping high sensitivity. In particular, the invention is to provide a photosensitive composition suitable as a lithographic printing plate material which can be subjected to direct plate making from digital data of a computer, etc. upon recording by using solid laser and semiconductor laser beams capable of radiating ultraviolet light, visible light and infrared light.

For the purpose of achieving the foregoing object, the present inventors made extensive and intensive investigations. As a result, it has been found that a photosensitive composition containing a sensitizing dye represented by the following formula (I) has sufficient sensitivity to oscillation wavelengths of semiconductor lasers and is excellent in storage stability, leading to accomplishment of the invention.

Specifically, the invention is as follows.

1. A photosensitive composition containing:
   (1) a sensitizing dye represented by the following formula (I),
   (2) an activator compound which causes a chemical change due to a mutual action with an electron excited state to be generated by light absorption of the sensitizing dye, thereby generating a radical or an acid, and
   (3) a polymerizable compound which reacts with at least one of a radical and an acid.

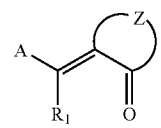

(I)

In the formula, Z represents a substituted divalent linking group capable of forming a 5-membered or 6-membered ring. However, the total volume of substituents arranged on the 5-membered or 6-membered ring formed by Z is 200 Å$^3$ (angstrom)$^3$ or more. $R_1$ represents a hydrogen atom or a monovalent non-metal atomic group. A represents an optionally substituted aromatic ring or hetero ring; and $R_1$ and A may be taken together to form an aliphatic or aromatic ring, 2. The photosensitive composition as set forth above in the item 1, wherein the sensitizing dye is any one of compounds represented by the following formulae (II) to (IV) or a combination thereof.

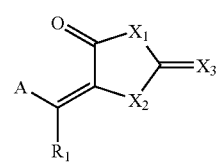

(II)

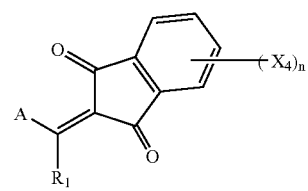

(III)

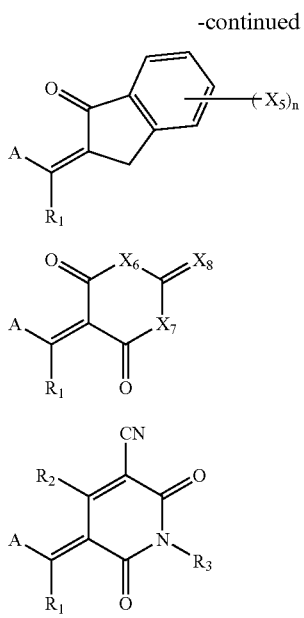

In the formulae, $R_1$ to $R_3$ each independently represents a hydrogen atom or a monovalent non-metal atomic group. $X_1$ to $X_3$ and $X_6$ to $X_8$ each independently represents an oxygen atom, a sulfur atom, or an $-N(R_4)-$; and $R_4$ represents a substituted or unsubstituted alkyl group, a substituted or unsubstituted alkenyl group, a substituted or unsubstituted aryl group, or a substituted or unsubstituted heteroaryl group. $X_4$ and $X_5$ each independently represents a hydrogen atom, a halogen, a substituted or unsubstituted alkyl group, a substituted or unsubstituted alkenyl group, an alkoxy group, a hydroxyl group, a nitro group, a carbonyl group, an ester group, a cyano group, or a substituted or unsubstituted aryl group. A represents an optionally substituted aromatic ring or hetero ring; and $R_1$ and $R_2$, or $R_3$ and A may be taken together to form an aliphatic or aromatic ring. However, the total volume of substituents present on $X_1$, $X_2$ and $X_3$ in the formula (II), the total volume of the benzene ring adjacent to the 5-membered ring and substituents thereof in the formulae (III) and (IV), the total volume of substituents present on $X_6$, $X_7$ and $X_8$ in the formula (V), and the total volume of $R_2$, $R_3$ and CN in the formula (VI) are each 200 Å$^3$ or more.

3. An image recording method comprising scan exposing an image recording material comprising a support having thereon a photosensitive layer containing the photosensitive composition as set forth above in the item 1 using a laser light source of from 350 to 450 nm.

An image recording material using the photosensitive composition of the invention, preferably a lithographic printing plate precursor is imparted high storage stability while keeping sufficient sensitivity suitable for scan exposure by lasers having a variety of wavelengths. This is useful because it is possible to impart practical usefulness to an initiation system comprising a sensitizing dye and an activator compound, which exhibits high sensitive but is hardly applicable because of insufficient storage stability, by changing only substituents without changing a basic skeleton of the sensitizing dye. That is, the invention is able to enhance the storage stability without lowering the sensitivity of the photographic material.

DETAILED DESCRIPTION OF THE INVENTION

The invention has been accomplished by the finding that by using the compound represented by the formula (I) as a sensitizing dye, it is possible to impart storage stability without hindering the sensitivity in a wavelength region corresponding to especially an absorption band of from 350 to 450 nm.

While details of the mechanism for enhancing the storage stability by the sensitizing dye represented by the formula (I) have not been completely elucidated yet, it is assumed that a mutual action in a minute level between the activator compound and the sensitizing dye is suppressed by steric hindrance due to a specific structure of the sensitizing dye (the "minute level" as referred to herein exhibits a level of slight dark polymerization at the time of unexposure, and a mutual action effect caused due to steric hindrance does not become problematic at the time of exposure), and as a result, the generation of an active radical at the time of storage is suppressed. That is, for example, when the photosensitive composition of the invention is used for a lithographic printing plate precursor, an active radical as generated at the time of exposure can sufficiently function so that it becomes possible to provide a lithographic printing plate having high storage stability.

An embodiment of the invention will be described below in detail.

(A) Photopolymerization Initiation System:

A photopolymerization initiation system which is used in the photosensitive composition of the invention comprises a sensitizing dye represented by the formula (I) and an activator compound.

(A1) Sensitizing Dye:

The sensitizing dye which constitutes the photopolymerization initiation system which is used in the photosensitive composition of the invention is a compound represented by the following formula (I).

In the formula, Z represents a substituted divalent linking group capable of forming a 5-membered or 6-membered ring. However, the total volume of substituents arranged on the 5-membered or 6-membered ring formed by Z is 200 Å$^3$ or more. $R_1$ represents a hydrogen atom or a monovalent non-metal atomic group. A represents an optionally substituted aromatic ring or hetero ring; and $R_1$ and A may be taken together to form an aliphatic or aromatic ring, $R_1$ represents a hydrogen atom or a monovalent non-metal atomic group, and preferably a substituted or unsubstituted alkyl group, a substituted or unsubstituted alkenyl group, a substituted or unsubstituted aryl group, or a substituted or unsubstituted heteroaryl group.

Above all, $R_1$ is preferably a hydrogen atom or an alkyl group, and more preferably an alkyl group having from 1 to 5 carbon atoms, which is taken together with A to form a ring structure. Examples of the preferred alkyl group include linear, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these, linear alkyl groups having from 1 to 12 carbon atoms, branched alkyl groups having from 3 to 12 carbon atoms, and cyclic alkyl groups having from 5 to 10 carbon atoms are more preferable.

As the substituent of the substituted alkyl group, a monovalent non-metal atomic group other than hydrogen is used. Preferred examples thereof include an alkyl group, a halogen atom (for example, —F, —Br, —Cl, and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycabonylamino group, an aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as "sulfonato group"), an alkoxy-sulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$O$_2$) and its conjugated base group (hereinafter referred to as "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as "alkylphosphonato group"), a monoarylphosphono group (—PO$_3$H(aryl)) and its conjugated based group (hereinafter referred to as "arylphosphonato group"), a phosphonoxy group (—OPO$_3$H$_2$) and its conjugated base group (hereinafter referred to as "phosphonatoxy group"), a dialkyl-phosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)), a monoalkylphosphonoxy group (—OPO$_3$H(alkyl)) or its conjugated base group (hereinafter referred to as "alkylphosphonatoxy group"), a monoarylphosphonoxy group (—OPO$_3$H(aryl)) or its conjugated base group (hereinafter referred to as "arylphosphonatoxy group"), a cyano group, a nitro group, an aryl group, a heteroaryl group, an alkenyl group, and an alkynyl group.

In these substituents, specific examples of the alkyl group include the foregoing alkyl groups; and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group, and a phosphonatophenyl group.

As the heteroaryl group, a monocyclic or polycyclic aromatic ring containing at least one of nitrogen, oxygen and sulfur atoms is used. As the especially preferred heteroaryl group, there are enumerated thiophene, thianthrene, furan, pyran, isobenzofuran, chromene, xanthene, pyrrole, pyrazole, isothiazole, isoxazole, pyrazine, pyrimidine, pyridazine, indolizine, isoindolizine, indoyl, indazole, purine, quinolizine, isoquinoline, phthalazine, naphthylidine, quinazoline, cinoline, pteridine, carbazole, carboline, phenanthrene, perimidine, phenanthroline, phthalazine, phenarsazine, and furazane. These may be further benzo-fused or may have a substituent.

Furthermore, examples of the alkenyl group include a vinyl group, a 1-propenyl group, a 1-butenyl group, a cinnamyl group, and a 2-chloro-1-ethenyl group; and examples of the alkynyl group include an ethynyl group, a 1-propynyl group, a 1-butynyl group, and a trimethylsilylethynyl group.

On the other hand, as the alkylene group on the substituted alkyl group, there are enumerated divalent organic residues resulting from elimination of any one of hydrogen atoms on the foregoing alkyl group having from 1 to 20 carbon atoms. Of these, linear alkylene groups having from 1 to 12 carbon atoms, branched alkylene groups having from 3 to 12 carbon atoms, and cyclic alkylene groups having from 5 to 10 carbon atoms are preferable.

The substituent of the preferred substituted alkyl group as $R_1$ as obtained by combining the substituent with the alkylene group is arbitrary. Specific examples of the preferred substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsul-famoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group; an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methyl-propenylmethyl group, a 2-propenyl group, a 2-butynyl group, and a 3-butynyl group.

Furthermore, examples of the substituted or unsubstituted alkenyl group which is preferred as $R_1$ include a vinyl group, a 1-propenyl group, a 1-butenyl group, a cinnamyl group, and a 2-chloro-1-ethenyl group.

Specific examples of the aryl group which is preferred as $R_1$ include ones resulting from the formation of a fused ring of from one to three benzene rings and ones resulting from the formation of a fused ring of a benzene ring and a 5-membered unsaturated ring. Specific examples thereof include a phenyl group, a naphthyl group, an anthryl group, a phenanthryl group, an indenyl group, an acenaphthenyl group, and a fluorenyl group. Of these, a phenyl group and a naphthyl group are more preferable.

Specific examples of the substituted aryl group which is preferred as $R_1$ include ones having a monovalent non-metal atomic group other than hydrogen as the substituent on the ring-forming carbon atoms of the foregoing aryl group. Examples of the preferred substituent include the foregoing alkyl groups and substituted alkyl groups and those as enumerated as the substituent in the foregoing substituted alkyl group. Preferred examples of such substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(meth-oxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

Furthermore, as the heteroaryl group which is preferred as $R_1$, a monocyclic or polycyclic aromatic ring containing at least one of nitrogen, oxygen and sulfur atoms is used. As the especially preferred heteroaryl group, there are enumerated thiophene, thianthrene, furan, pyran, isobenzofuran, chromene, xanthene, pyrrole, pyrazole, isothiazole, isoxazole, pyrazine, pyrimidine, pyridazine, indolizine, isoindolizine, indoyl, indazole, purine, quinolizine, isoquinoline, phthalazine, naphthylidine, quinazoline, cinoline, pteridine, carbazole, carboline, phenanthrene, perimidine, phenanthroline, phthalazine, phenarsazine, and furazane. These may be further benzo-fused or may have a substituent.

Next, Z in the formula (I) will be described below. Z represents a divalent linking group necessary for forming an acidic nucleus jointly with an atom adjacent to Z. The acidic nucleus represents a substituted 5-membered or 6-membered ring. Specific examples of the acidic nucleus include a 1,3-dicarbonyl nucleus (for example, 1,3-indanedione and 1,3-dioxane-4,6-dione), a pyrazolinone nucleus (for example, 3-methyl-1-phenyl-2-pyrazolin-5-one, 1-phenyl-2-pyrazolin-5-one, and 1-(2-benzothiazolyl)-3-methyl-2-pyrazolin-5-one), an isoxazolinone nucleus (for example, 3-phenyl-2-isoxazolin-5-one and 3-methyl-2-isoxazolin-5-one), an oxyindole nucleus (for example, a 1-alkyl-2,3-dihydro-2-oxyindole), a 2-thio-2,4-thiazolidinedione nucleus (for example, rhodanine and N-substituted derivatives such as 3-methylrhodanine, 3-ethylrhodanine, 3-phenylrhodanine, 3-allylrhodanine, 3-benzylrhodanine, 3-carboxymethylrhodanine, 3-carboxyethylrhodanine, 3-methoxycarbonylmethylrhodanine, 3-hydroxyethylrhodanine, and 3-morpholinoethylrhodanine), a 2-thio-2,4-oxazolinedione nucleus (namely, a 2-thio-2,4-(3H,4H)-oxazolediedione nucleus, for example, 2-ethyl-2-thio-2,4-oxazolinedione), a thianaphthenone nucleus (for example, 3(2H)-thianaphthenone and 3(2H)-thianaphthenone-1,1-dioxide), a 2-thio-2,5-thiazolidinedione nucleus (for example, 3-ethyl-2-thio-2,5-thiazolidinedione), a 2,4-thiazolidinedione nucleus (for example, 2,4-thiazolidinedione, 3-ethyl-4-thiazolidinedione, and 3-phenyl-2,4-thiazolidinedione), a thiazolidinone nucleus (for example, 4-thiazolidinone, 3-ethyl-4-thiazolidinone, 2-ethylmercapto-4-thiazolidinone, and 2-methylphenylamino-4-thiazolidinone), a 2-imino-2-oxazolin-4-one nucleus (namely, a pseudo hydantoin nucleus), a 2,4-imidazolidinedione nucleus (namely, a hydantoin nucleus, for example, 2,4-imidazolidinedione, 3-ethyl-2,4-imidazolidinedione, and 1,3-diethyl-2,4-imidazolidinedione), a 2-thio-2,4-imidazolidinedione nucleus (namely, a thiohydantoin nucleus, for example, 2-thio-2,4-imidazolidinedione, 3-ethyl-2-thio-2,4-imidazolidinedione, and 1,3-diethyl-2-thio-2,4-imidazolidinedione), an imidazolin-5-one nucleus (for example, 2-propylmercapto-2-imidazolin-5-one), a furan-5-one nucleus, a thioindoxyl nucleus (for example, 5-methylthioindoxyl), a barbituric acid nucleus, and a thiobarbituric acid nucleus. Above all, an oxazolidinone skeleton, an iminoöxazolidinone skeleton, and a barbituric acid skeleton are preferable; and an iminoöxazolidinone skeleton is more preferable.

Here, according to the invention, the total volume of substituents in Z is 200 Å$^3$ or more, and preferably from 200 to 700 Å$^3$.

In the invention, the total volume of substituents can be measured by known means in the industry. For example, it can be measured by using the Cache system (Computer Aided Chemistry Ver. 5.5, manufactured by Fujitsu Limited). Specifically, the volume of each substituent can be determined through operation steps of (1) drawing a skeleton of the substituent, (2) performing optimization by the PM-3 geometry, (3) registering the data on the project leader, and (4) defining measurement parameters by [(property of subsurface)⇒(volume)⇒(standard procedure)] and measuring them.

Next, A in the formula (I) will be described. A represents an optionally substituted aromatic ring or hetero ring. Specific examples of the optionally substituted aromatic ring or hetero ring include the same groups as enumerated in $R_1$ in the formula (I).

Above all, an alkoxy group, a thioalkyl group, and an amino group-containing aryl group are preferable as A; and an amino group-containing aryl group is especially preferable as A.

Of the foregoing sensitizing dyes represented by the formula (I), dyes having a structure represented by any one of the following formulae (II) to (VI) are especially preferable because they give a photosensitive composition having not only high sensitizing ability but also very excellent storage stability.

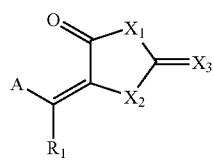
(II)

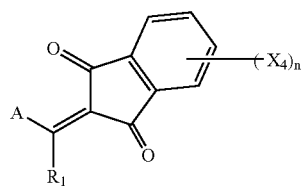
(III)

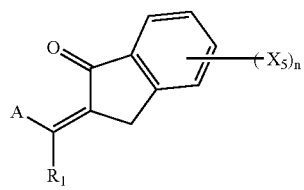
(IV)

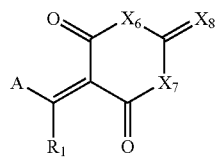
(V)

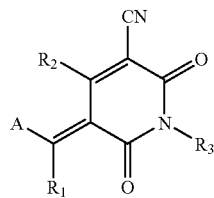
(VI)

In the formulae, $R_1$ to $R_3$ each independently represents a hydrogen atom or a monovalent non-metal atomic group. $X_1$ to $X_3$ and $X_6$ to $X_8$ each independently represents an oxygen atom, a sulfur atom, or an —$N(R_4)$—; and $R_4$ represents a substituted or unsubstituted alkyl group, a substituted or unsubstituted alkenyl group, a substituted or unsubstituted aryl group, or a substituted or unsubstituted heteroaryl group. $X_4$ and $X_5$ each independently represents a hydrogen atom, a halogen, a substituted or unsubstituted alkyl group, a substituted or unsubstituted alkenyl group, an alkoxy group, a hydroxyl group, a nitro group, a carbonyl group, an ester group, a cyano group, or a substituted or unsubstituted aryl group. A represents an optionally substituted aromatic ring or hetero ring; and $R_1$ and $R_2$, or $R_3$ and A may be taken together to form an aliphatic or aromatic ring. However, the total volume of substituents present on $X_1$, $X_2$ and $X_3$ in the formula (II), the total volume of the benzene ring adjacent to the 5-membered ring and substituents thereof in the formulae (III) and (IV), the total volume of substituents present on $X_6$, $X_7$ and $X_8$ in the formula (V), and the total volume of $R_2$, $R_3$ and CN in the formula (VI) are each 200 $Å^3$ or more.

More specifically, in the formula (II), the total volume of substituents as referred to herein means the total volume of substituents present on $X_1$, $X_2$ and $X_3$ but does not include the volume of $X_1$, $X_2$ and $X_3$ themselves. In the formulae (III) and (IV), the total volume of substituents as referred to herein means the total volume of the benzene ring adjacent to the 5-membered ring and substituents thereof but does not include the carbon atoms (carbonyls) on the 5-membered ring. In the formula (V), the total volume of substituents as referred to herein means the total volume of substituents present on $X_6$, $X_7$ and $X_8$ but does not include the volume of $X_6$, $X_7$ and $X_8$ themselves and does not include the carbon atoms (carbonyls) on the 5-membered ring. In the formula (VI), the total volume of substituents as referred to herein means the total volume of $R_2$, $R_3$ and CN but does not include the atomic group constituting the 6-membered ring and the oxygen atoms (carbonyls) on the 6-membered ring.

Incidentally, as shown in the formulae (III) and (IV), when the substituent on Z is present as the fused ring with the 5-membered ring or 6-membered ring of Z, substituents including the surrounding of the common ring are included in the substituent.

The formulae (II) to (VI) will be described below in detail. In the formulae (II) to (VI), $R_1$ to $R_3$ are each synonymous with $R_1$ in the formula (I).

$X_1$ to $X_3$ and $X_6$ to $X_8$ each independently represents an oxygen atom, a sulfur atom, or an —$N(R_4)$—. $X_4$ and $X_5$ each independently represents a hydrogen atom, a halogen, a substituted or unsubstituted alkyl group (for example, an alkyl group having from 1 to 20 carbon atoms), a substituted or unsubstituted alkenyl group, an alkoxy group (for example, an alkoxy group having from 1 to 10 carbon atoms), a hydroxyl group, a nitro group, a carbonyl group, an ester group, a cyano group, or a substituted or unsubstituted aryl group, with a halogen, an ester group and a cyano group being more preferred.

$R_4$ represents a substituted or unsubstituted alkyl group, a substituted or unsubstituted alkenyl group, a substituted or unsubstituted aryl group, or a substituted or unsubstituted heteroaryl group. Specific examples thereof include the same groups as enumerated in $R_1$ in the formula (I). Above all, a substituted or unsubstituted alkyl group and a substituted or unsubstituted aryl group are preferable. A sensitizing dye having a structure represented by the following formula (VIII) and having the total volume of $R_5$ and the imino substituent segment of 200 $Å^3$ or more is more preferable.

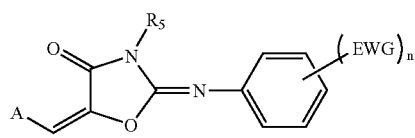

(VIII)

In the formula, $R_5$ represents a hydrogen atom or a substituted or unsubstituted alkyl group. EWG represents an electron withdrawing group, and specific examples thereof include a halogen atom, an ester group, an amide group, a nitro group, a cyano group, a sulfonic group, and a carboxyl group, with a halogen atom, an ester group and a cyano group being preferred. n is from 0 to 3. A represents an optionally substituted aromatic ring or hetero ring, and $R_5$ and A may be taken together to form an aliphatic or aromatic ring.

The sensitizing dyes represented by the foregoing formulae (I) to (VIII) are obtained by condensation reaction of the foregoing acidic nucleus or an active methylene group-containing acidic nucleus with a substituted or unsubstituted polycyclic compound derivative.

Specific examples (D1) to (D21) which are preferable as the compound represented by the formula (I) will be given below, but it should not be construed that the invention is limited thereto. Furthermore, isomers due to a double bond which binds the acidic group to the polycyclic compound skeleton are not completely elucidated yet, and the invention is never limited to either one isomer.

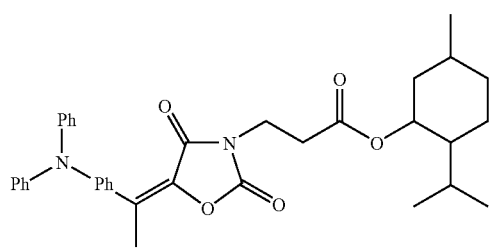

(D-1)

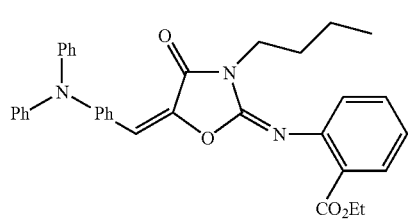

(D-2)

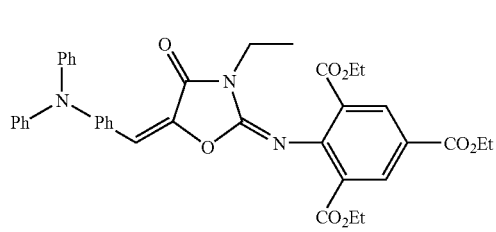

(D-3)

(D-4)

(D-5)

(D-6)

(D-7)

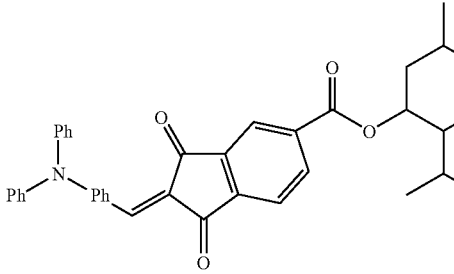

(D-8)

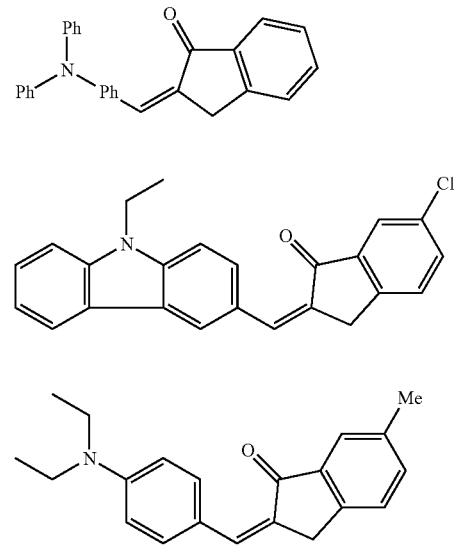
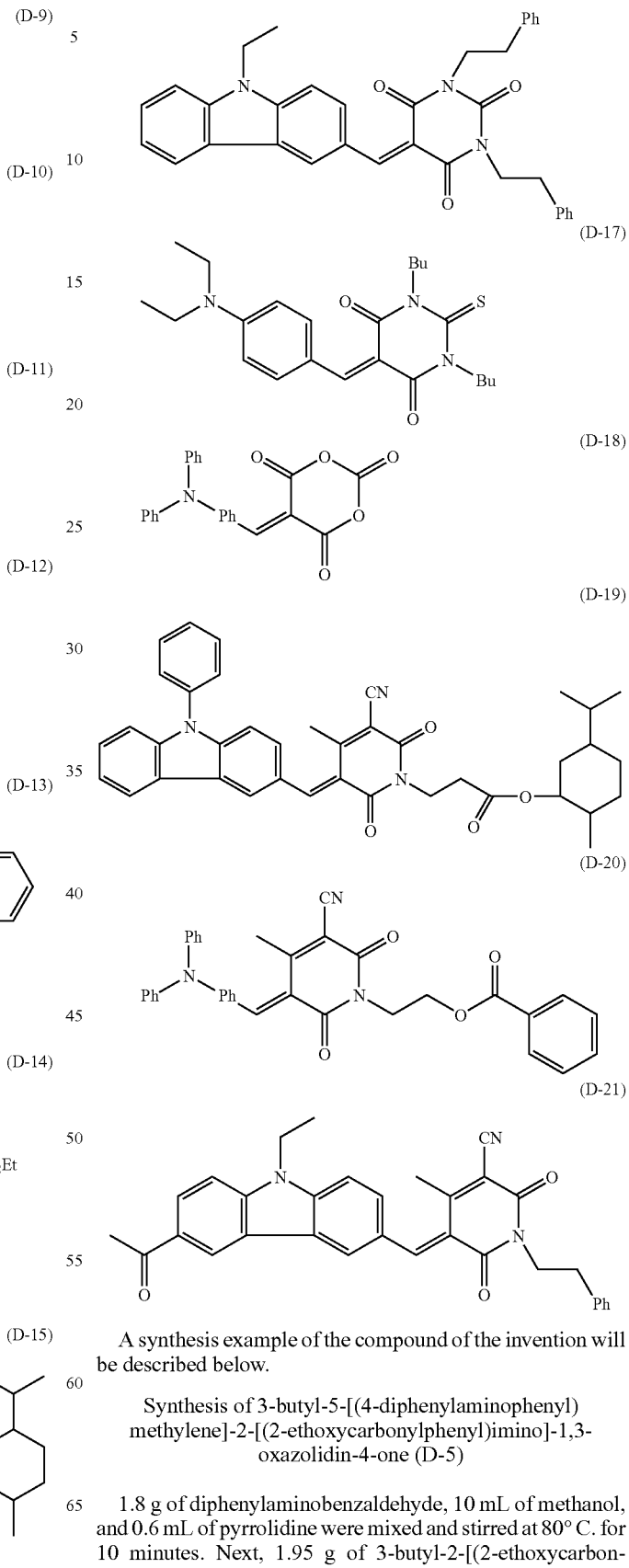
A synthesis example of the compound of the invention will be described below.
Synthesis of 3-butyl-5-[(4-diphenylaminophenyl)methylene]-2-[(2-ethoxycarbonylphenyl)imino]-1,3-oxazolidin-4-one (D-5)
1.8 g of diphenylaminobenzaldehyde, 10 mL of methanol, and 0.6 mL of pyrrolidine were mixed and stirred at 80° C. for 10 minutes. Next, 1.95 g of 3-butyl-2-[(2-ethoxycarbonylphenyl)imino]-1,3-oxazolidin-4-one was dissolved in 5 mL of methanol, and the solution was dropped over 5 minutes. The temperature was then raised to 90° C., and the mixture was stirred for 7 hours.

Thereafter, a target product was formed in a powder form in the reaction solution which had been stirred at 90° C. for 7 hours. This product was subjected to filtration by a filter while rinsing with methanol, thereby obtaining 2.4 g (yield: 71%, purity: 98%) of 3-butyl-5-[(4-diphenylaminophenyl)methylene]-2-[(2-ethoxycarbonylphenyl)imino]-1,3-oxazolidin-4-one.

Other illustrative compounds can be synthesized in a similar manner by properly choosing the staring substances, compounds to be added, and so no.

With respect to the sensitizing dye having a specific structure, which is contained in the photosensitive composition of the invention, when processed into a lithographic printing plate precursor, it is possible to carry out a variety of chemical modifications for the purpose of improving characteristics of the photosensitive layer. For example, when the sensitizing dye is coupled with an addition polymerizable compound structure (for example, an acryloyl group and a methacryloyl group) by a method including covalent bonding, ionic bonding, and hydrogen bonding, it is possible to strengthen the exposed film or to suppress unnecessary deposition of the dye from the film after exposure.

When the sensitizing dye is coupled with an activator such as titanocene compounds as described later or other radical generating part (for example, reduction decomposable sites (such as alkyl halides, oniums, peroxides, biimidazoles, oniums, and biimidazoles) and oxidation cleaving sites (such as borates, amines, trimethylsilylmethyl, carboxymethyl, carbonyl, and imines), it is possible to markedly enhance the photosensitivity especially in a low concentration state of the photopolymerization initiation system.

Moreover, for the purpose of enhancing the treatment aptitude against an (alkaline) aqueous developing solution, an aspect of which is a preferred embodiment of a lithographic printing plate precursor using the photosensitive composition of the invention, it is effective to introduce a hydrophilic site (for example, acid groups or polar groups such as a carboxyl group and its esters, a sulfonic group and its esters, and an ethylene oxide group).

In particular, a hydrophilic group of an ester type has characteristic features such that it is excellent in compatibility in the photosensitive layer of the lithographic printing plate precursor because it has a relatively hydrophobic structure and that it generates an acid group due to hydrolysis in the developing solution, thereby increasing the hydrophilicity. Besides, for example, it is possible to properly introduce a substituent for the purposes of enhancing the compatibility in the photosensitive layer of the lithographic printing plate precursor and suppressing the deposition of crystal.

For example, in a certain photosensitive system, there may be the case where an unsaturated bond such as an aryl group and an allyl group is very useful for enhancing the compatibility. Furthermore, by introducing a steric hindrance between the π-planes of the dye by a method such as introduction of a branched alkyl structure, it is possible to markedly suppress the deposition of crystal. Moreover, by introducing a phosphonic group, an epoxy group, a trialkoxysilyl group, etc., it is possible to enhance adhesion to inorganic materials such as metals and metal oxides. Besides, a method for polymerizing the sensitizing dye can be applied depending upon the intended purpose.

Details of the use method regarding which structure of the sensitizing dye is to be used, whether the sensitizing dye is to be used singly or in combination of two or more kinds thereof, or what addition amount of the sensitizing dye is to be employed can be properly set up adaptive with the performance design of an ultimate photographic material. For example, by jointly using two or more kinds of the sensitizing dyes, it is possible to enhance the compatibility with the photosensitive layer of the lithographic printing plate precursor.

In choosing the sensitizing dye, in addition to the sensitivity, a molar absorption coefficient at a luminescence wavelength of a light source to be used is an important factor. By using a dye having a large molar absorption coefficient, it is possible to make the addition amount of the dye relatively low. Therefore, use of such a dye is economical and advantageous in view of film physical properties of the photosensitive layer. Since the photosensitivity of the photosensitive layer, the resolution, and the physical properties of the exposed film are largely influenced by the absorbance at a wavelength of the light source, the addition amount of the sensitizing dye is to be properly chosen while taking into consideration these matters.

For example, in a region where the absorbance is low as 0.1 or less, the sensitivity is lowered. Furthermore, the resolution becomes low due to the influence of halation. However, for the purpose of hardening a thick film of 5 μm or more, there may be the case where when the absorbance is low in this way, the hardness can be rather increased. Moreover, in a region where the absorbance is high as 3 or more, the major part of light is absorbed on the surface of the photosensitive layer, and hardening in the inner part is hindered. For example, when used as a lithographic printing plate precursor, adhesion to a substrate becomes insufficient.

In the use as a lithographic printing plate precursor which is used in a relatively thin film thickness, it is preferred to set up the addition amount of the sensitizing dye such that the absorbance of the photosensitive layer is in the range of from 0.1 to 1.5, and preferably from 0.25 to 1.

Furthermore, in the application as a lithographic printing plate precursor, the addition amount of the sensitizing dye to be used is usually in the range of from 0.05 to 30 parts by weight, preferably from 0.1 to 20 parts by weight, and more preferably from 0.2 to 10 parts by weight based on 100 parts by weight of the photosensitive layer components.

(A2) Activator Compound:

Next, the activator compound which is the second essential component of the photopolymerization initiation system in the invention will be described below.

The activator compound as referred to in the invention is a compound which causes a chemical change through a mutual action with the electron excited state as generated by light absorption of the sensitizing dye, thereby generating a radical or an acid. The thus generated radical or acid will be hereinafter referred to simply as "active species". In the case where such a compound is absent, or in the case where only the activator is used singly, practically satisfactory sensitivity is not obtained. However, as one embodiment of using the activator compound jointly with the foregoing sensitizing dye, it is also possible to apply them as a single compound by an adequate chemical method (for example, connection by chemical bonding of the sensitizing dye to the activator compound). Such technical thoughts are disclosed in, for example, Japanese Patent No. 2,720,195.

In general, it is thought that the major part of these activators generate an active species through an initial chemical process of any one of the following (1) to (3). That is, there are included (1) reductive decomposition of the activator based on an electron transfer reaction from the electron excited state of the sensitizing dye to the activator; (2) an oxidative decomposition of the activator based on electron transfer of the activator to the electron excited state of the sensitizing dye; and (3) decomposition from the electron excited state of the activator based on energy transfer from the electron excited state of the sensitizing dye to the activator. Among the foregoing (1) to (3) types, what type the individual activator compound belongs to is often vague. However, an important characteristic feature of the sensitizing dye in the invention resides in the matter that a very high sensitizing effect can reveal through a combination with any type of activator.

As specific activator compounds, ones which are known by those skilled in the art can be used without limitations. Specifically, a number of activator compounds are described in, for example, Bruce M. Monroe, et al., *Chemical Revue*, 93, 435 (1993); R. S. Davidson, *Journal of Photochemistry and Biology A: Chemistry*, 73, 81 (1993); J. P. Faussier, "Photo-initiated Polymerization—Theory and Applications": *Rapra Review*, Vol. 9, Report, Rapra Technology (1998); and T. Tsunooka, et al., *Prog. Poly. Sic.*, 21, 1 (1996). Furthermore, as other compound groups having the foregoing functions (1) and (2), there are also known compound groups which oxidatively or reductively generate bond cleavage, as described in, for example, F. D. Saeva, *Topics in Current Chemistry*, 156, 59 (1990); G. G. Maslak, *Topics in Current Chemistry*, 189, 1 (1993); H. B. Shuster, et al., *JACS*, 112, 6329 (1990); and I. D. F. Eaton, et al., *JACS*, 102, 3298 (1980).

Specific examples of the preferred activator will be described below while classifying into (a) one which is reduced to cause bond cleavage, thereby generating an active species, (b) one which is oxidized to cause bond cleavage, thereby generating an active species, and (c) others. However, with respect to what class the individual compound belongs to, there is often no commonly accepted theory, and it should be construed that the invention is never restricted by any description regarding these reaction mechanisms.

(a) One Which is Reduced to Cause Bond Cleavage, Thereby Generating an Active Species:

Compounds having a carbon-halogen bond: It is considered that the carbon-halogen bond is reductively cleaved to generate an active species (as described in, for example, *Polymer Preprints, Jpn.*, 41(3), 542 (1992)). A radical or an acid can be generated as the active species. Specific examples of the compound which can be suitably used include halomethyl-s-triazines; and besides, halomethyl oxadiazoles which can be easily synthesized by those skilled in the art by a synthesis method as described in M. P. Hutt, E. F. Elslager and L. M. Merbel, *Journal of Heterocyclic Chemistry*, 7, 511 (1970); and compounds described in each of German Patents Nos. 2,641,100, 3,333,450, 3,021,590 and 3,021,599.

Compounds having a nitrogen-nitrogen bond or a nitrogen-containing hetero ring-nitrogen-containing hetero ring bond: Bond cleavage is reductively caused (as described in, for example, *J. Pys. Chem.*, 96, 207 (1992)). Specifically, hexaaryl biimidazoles can be suitably used. The active species as generated is a lophine radical. When used jointly with a hydrogen-providing material as the need arises, it starts a radical chain reaction, and besides, image formation using an oxidation reaction by a lophine radical is known (as described in *J. Imaging Sci.*, 30, 215 (1986)).

Compounds having an oxygen-oxygen bond: It is considered that the oxygen-oxygen bond is reductively cleaved to generate an active radical (as described in, for example, *Polym. Adv. Technol.*, 1, 287 (1990)). Specifically, for example, organic peroxides are suitably used. A radical can be generated as the active species.

Onium compounds: It is considered that a carbon-hetero bond or an oxygen-nitrogen bond is reductively cleaved to generate an active species (as described in, for example, *J. Photopolym. Sci. Technol.*, 3, 149 (1990)). Specific examples of the onium compound which can be suitably used include iodonium salts as described in European Patent No. 104,143, U.S. Pat. No. 4,837,124, JP-A-2-150848, and JP-A-2-96514; sulfonium salts as described in European Patents Nos. 370, 693, 233,567, 297,443, 297,442, 279,210 and 422,570 and U.S. Pat. Nos. 3,902,144, 4,933,377, 4,760,013, 4,734,444 and 2,833,827; diazonium salts (for example, optionally substituted benzodiazonium); diazonium salt resins (for example, a formaldehyde resin of diazodiphenylamine); N-alkoxypyridinium salts (for example, ones described in U.S. Pat. No. 4,743,528, JP-A-63-138345, JP-A-63-142345, JP-A-63-142346, and JP-B-46-42363, and specifically 1-methoxy-4-phenylpyridinium tetrafluoroborate, etc.); and compounds as described in JP-B-52-147277, JP-B-52-14278, and JP-B-52-14279. A radical or an acid is generated as the active species.

Active esters: Nitrobenzyl esters of a sulfonic acid or a carboxylic acid, esters of a sulfonic acid or a carboxylic acid and an N-hydroxy compound (for example, N-hydroxy-phthalimide and oximes), sulfonic acid esters of pyrogallol, naphthoquinonediazide-4-sulfonic acid esters, and the like can be reductively cleaved. A radical or an acid can be generated as the active species. Specific examples of sulfonic acid esters include nitrobenzyl ester compounds as described in European Patents Nos. 0,290,750, 046, 083, 156, 153, 271,851 and 0,388,343, U.S. Pat. Nos. 3,901,710 and 4,181, 531, JP-A-60-198538, and JP-A-53-133022; iminosulfonate compounds as described in European Patents Nos. 0,199,672, 84,515, 199,672, 0,44,115 and 0,101,122, U.S. Pat. Nos. 4,618,564, 4,371,605 and 4,431,774, JP-A-64-18143, JP-A-2-245756, and JP-A-4-365048; and compounds as described in JP-B-62-6223, JP-B-63-14340, and JP-A-59-174831. Furthermore, there are enumerated the following compounds.

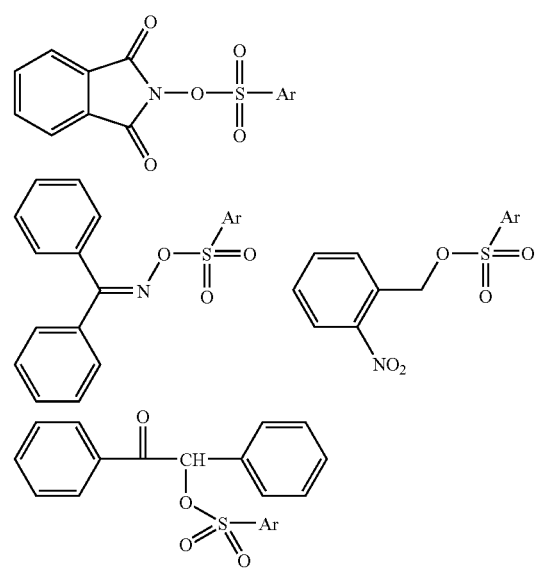

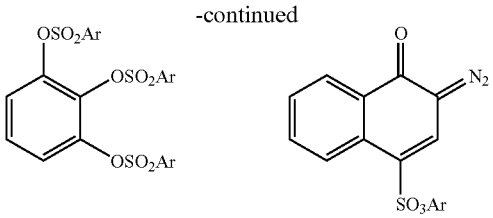

In the formulae, Ar represents an optionally substituted aromatic group or aliphatic group.

It is also possible to generate a base as the active species, and for example, the following compound groups are known.

Ferrocene and iron-allene complexes: An active radical can be reductively generated. Specific examples are disclosed in JP-A-1-304453 and JP-A-1-152109.

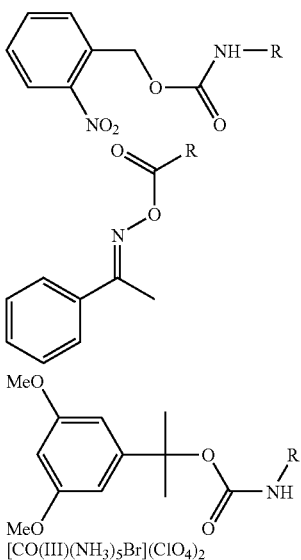

In the formulae, R represents an optionally substituted aliphatic group or aromatic group.

Disulfones: An S—S bond cleavage can be reductively caused to generate an acid. For example, diphenyldisulfones as described in JP-A-61-166544 are known.

(b) One Which is Oxidized to Cause Bond Cleavage, Thereby Generating an Active Species:

Alkylate complexes: It is considered that a carbon-hetero bond is oxidatively cleaved to generate an active radical (as described in, for example, *J. Am. Chem. Soc.*, 112, 6329 (1990)). Specifically, for example, triarylalkyl borates are suitably used.

Alkylamine compounds: It is considered that a C—X bond on the carbon adjacent to nitrogen is cleaved due to oxidation to generate an active radical (as described in, for example, *J. Am. Chem. Soc.*, 116, 4211 (1994)). X is suitably a hydrogen atom, a carboxyl group, a trimethylsilyl group, a benzyl group, etc. Specific examples of the alkylamine compound include ethanolamines, N-phenylglycines, and N-trimethyl-silylmethylanilines.

Sulfur-containing and tin-containing compounds: Ones resulting from substitution of the nitrogen atom of the foregoing amine with a sulfur atom or a tin atom can generate an active radical due to a similar action. It is also known that a compound having an S—S bond causes sensitization due to S—S cleavage.

α-Substituted methylcarbonyl compounds: An active radical can be generated due to bond cleavage between carbonyl and α-carbon upon oxidation. Ones resulting from conversion of the carbonyl into oxime ether exhibit a similar action. Specific examples of the compound include 2-alkyl-1-[4-(alkylthio)phenyl]-2-morpholinopropanone-1 compounds and oxime ethers obtained by reacting such a compound with a hydroxylamine and then etherifying the N—OH.

Sulfinic acid salts: An active radical can be reductively generated. Specific examples thereof include sodium arylsulfinates.

(c) Others:

While the sensitization mechanism is not elucidated yet, there are a number of compounds capable of functioning as the activator. Examples thereof include organometallic compounds such as tinanocenes and ferrocenes, aromatic ketones, acyl phosphines, and bisacyl phosphines. A radical or an acid can be generated as the active species.

Among the activator compounds which are used in the invention, preferred compound groups which are especially excellent in sensitivity and stability will be specifically enumerated below.

(1) Halomethyltriazines:

There is enumerated a compound represented by the following formula [II]. This compound is especially excellent in the radical generation and acid generating ability.

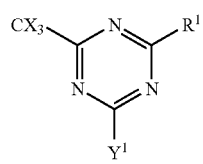

[II]

In the formula [II], X represents a halogen atom. $Y^1$ represents $-CX'_3$, $-NH_2$, $-NHR^{1'}$, $-NR^{1'}_2$, or $-OR^{1'}$. Here, $R^{1'}$ represents an alkyl group, a substituted alkyl group, an aryl group, or a substituted aryl group. $R^1$ represents $-CX_3$, an alkyl group, a substituted alkyl group, an aryl group, a substituted aryl group, or a substituted alkenyl group.

Specific examples of such a compound include compounds as described in, for example, Wakabayashi, et al., *Bull. Chem. Soc. Japan*, 42, 2924 (1969), such as 2-phenyl-4,6-bis(trichloromethyl)-S-triazine, 2-(p-chloro-phenyl)-4,6-bis(trichloromethyl)-S-triazine, 2-(p-tolyl)-4,6-bis-(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris-(trichloromethyl)-S-triazine, 2-methyl-4,6-bis(trichloromethyl)-S-triazine, 2-n-nonyl-4,6-bis(trichloromethyl)-S-triazine, and 2-(α,α,β-trichloroethyl)-4,6-bis(tri-chloromethyl)-s-triazine. Besides, there can be enumerated compounds as described in U.K. Patent No. 1,388,492, such as 2-styryl-4,6-bis(trichloromethyl)-S-triazine, 2-(p-methylstyryl)-4,6-bis(trichloromethyl)-S-triazine, 2-(p-methoxy-styryl)-4,6-bis(trichloromethyl)-S-triazine, and 2-(p-meth-oxystyryl)-4-amino-6-trichloromethyl-S-triazine; compounds as described in JP-A-53-133428, such as 2-(4-methoxy-naphtho-1-yl)-4,6-bis-trichloromethyl-S-triazine, 2-(4-ethoxy-naphtho-1-yl)-4,6-bis-trichloromethyl-S-triazine, 2-[4-(2-ethoxyethyl)-naphtho-1-yl]-4,6-bis-trichloromethyl-S-triazine, 2-(4,7-dimethoxy-naphtho-1-yl)-4,6-bis-trichloromethyl-S-triazine, and 2-(acenaphtho-5-yl)-4,6-bis-trichloromethyl-S-triazine; and compounds as described in German Patent No. 3,337,024, such as the following compounds.

ine, 2,4,6-tris(tribromomethyl)-S-triazine, 2,4,6-tris(dibromomethyl)-S-triazine, 2-amino-4-methyl-6-tribromomethyl-S-triazine, and 2-methoxy-4-methyl-6-trichloromethyl-S-triazine.

Moreover, there can be enumerated compounds as described in JP-A-62-58241, such as the following compounds.

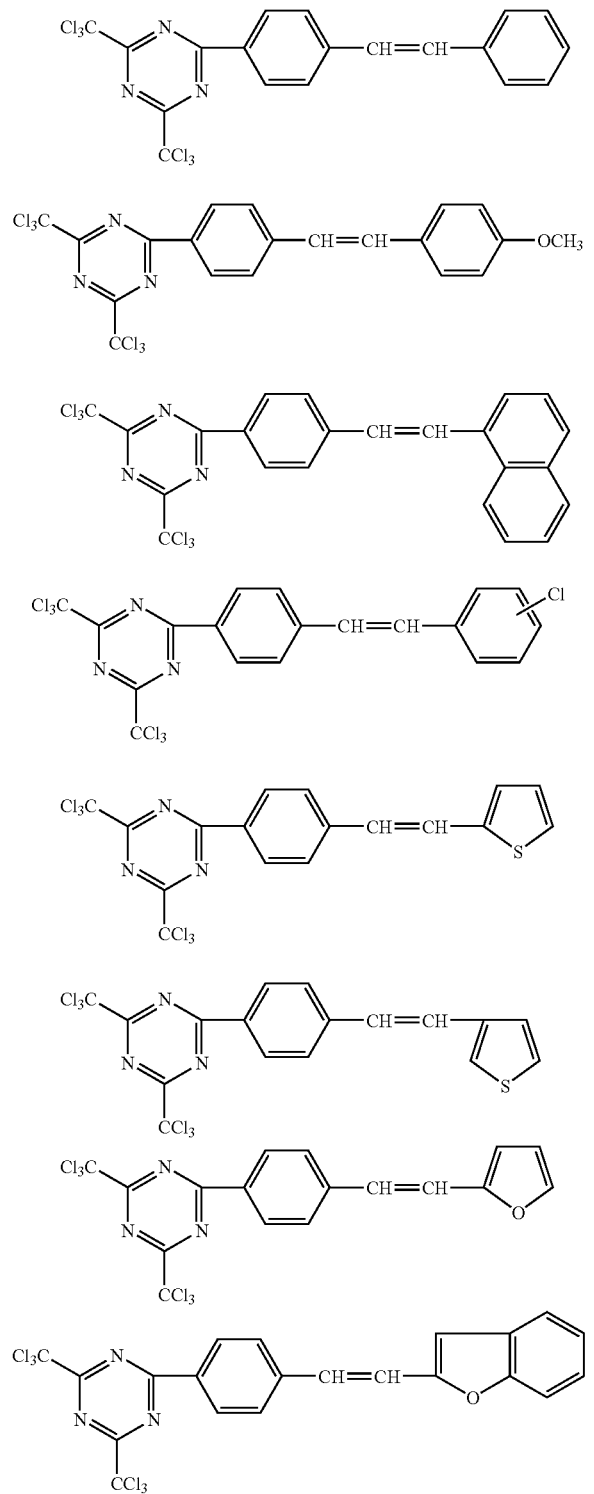

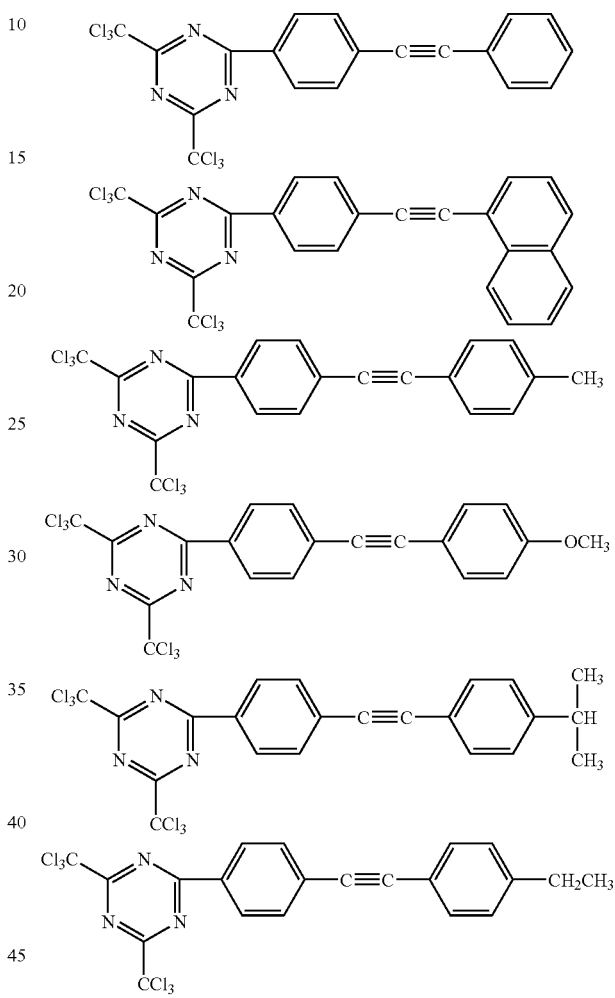

Moreover, there can be enumerated compounds as described in JP-A-5-281728, such as the following compounds.

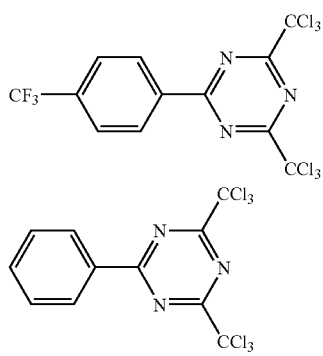

Furthermore, there can be enumerated compounds as described in F. C. Schaefer, et al., *J. Org. Chem.*, 29, 1527 (1964), such as 2-methyl-4,6-bis(tribromomethyl)-S-triaz-

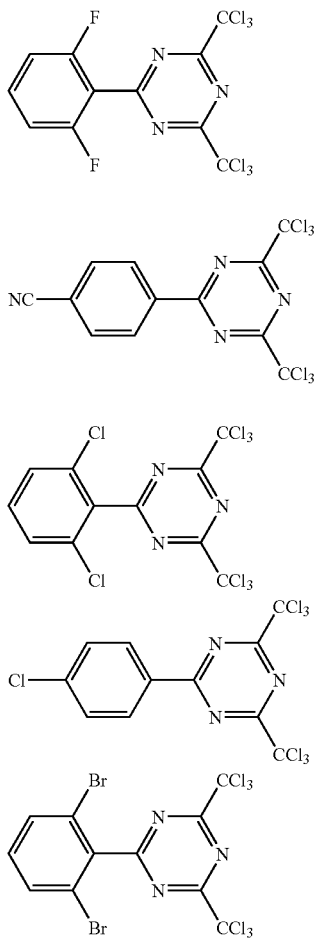

(2) Titanocenes:

As the titanocene compound which is especially suitably used as the activator, any titanocene compound which when light exposed in the copresence of the foregoing sensitizing dye, can generate an active species is useful. For example, known compounds as described in JP-A-59-152396, JP-A-61-151197, JP-A-63-41483, JP-A-63-41484, JP-A-2-249, JP-A-2-291, JP-A-3-27393, JP-A-3-12403, and JP-A-6-41170 can be properly chosen and used.

More specifically, there can be enumerated dicyclopentadienyl-Ti-dihcloride, dicyclopentadienyl-Ti-bisphenyl, dicyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, dicyclo-pentadienyl-Ti-bis-2,4-difluorophen-1-yl, dimethylcyclo-pentadienyl-Ti-bis-2,3,4,5,6-pentafluorophen-1-yl, dimethylcyclopentadienyl-Ti-bis-2,3,5,6-tetrafluorophen-1-yl, di-methylcyclopentadienyl-Ti-bis-2,4-difluorophen-1-yl, and bis(cyclopentadienyl)-bis(2,6-difluoro-3-(pyl-1-yl)phenyl)titanium.

(3) Borate Salt Compounds:

A borate salt represented by the following formula [III] is excellent in radical generating ability.

In the formula [III], $R^{51}$, $R^{52}$, $R^{53}$, and $R^{54}$ may be the same or different and each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group; and two or more groups of $R^{51}$, $R^{52}$, $R^{53}$, and $R^{54}$ may be taken together to form a cyclic structure, provided that at least one of $R^{51}$, $R^{52}$, $R^{53}$, and $R^{54}$ is a substituted or unsubstituted alkyl group. $Z^+$ represents an alkali metal cation or a quaternary ammonium cation.

The alkyl group represented by the foregoing $R^{51}$ to $R^{54}$ includes linear, branched or cyclic alkyl groups and preferably has from 1 to 18 carbon atoms. Specific examples thereof include methyl, ethyl, propyl, isopropyl, butyl, pentyl, hexyl, octyl, stearyl, cyclobutyl, cyclopentyl, and cyclohexyl. Furthermore, the substituted alkyl group includes the foregoing alkyl groups which, however, have, as a substituent, a halogen atom (for example, —Cl and —Br), a cyano group, a nitro group, an aryl group (preferably a phenyl group), a hydroxyl group, a group represented by the following formula:

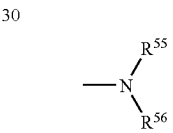

(wherein $R^{55}$ and $R^{56}$ each independently represents a hydrogen atom, an alkyl group having from 1 to 14 carbon atoms, or an aryl group), —COOR$^{57}$ (wherein $R^{57}$ represents a hydrogen atom, an alkyl group having from 1 to 14 carbon atoms, or an aryl group), or —COOR$^{58}$ or —OR$^{58}$ (wherein $R^{58}$ represents an alkyl group having from 1 to 14 carbon atoms or an aryl group).

The aryl group represented by the foregoing $R^{51}$ to $R^{54}$ includes monocyclic to tricyclic aryl groups such as a phenyl group and a naphthyl group; and the substituted aryl group includes the foregoing aryl groups which, however, have, as a substituent, any one of the substituents as in the foregoing substituted alkyl group or an alkyl group having from 1 to 14 carbon atoms.

The alkenyl group represented by the foregoing $R^{51}$ to $R^{54}$ includes linear, branched or cyclic alkenyl groups having from 2 to 18 carbon atoms; and examples of the substituent of the substituted alkenyl group include the same substituents as enumerated as the substituent of the foregoing substituted alkyl group.

The alkynyl group represented by the foregoing $R^{51}$ to $R^{54}$ includes linear or branched alkynyl groups having from 2 to 28 carbon atoms; and examples of the substituent of the substituted alkynyl group include the same substituents as enumerated as the substituent of the foregoing substituted alkyl group.

Furthermore, examples of the heterocyclic group represented by the foregoing $R^{51}$ to $R^{54}$ include five or more membered rings containing at least one of N, S and O. Of these, 5-membered to 7-membered heterocyclic groups are preferable. The heterocyclic ring may contain a fused ring. The heterocyclic group may further have, as a substituent, the same substituent as enumerated as the substituent of the foregoing substituted aryl group.

Specific examples of the compound represented by the formula [III] include compounds as described in U.S. Pat. Nos. 3,567,453 and 4,343,891 and European Patents Nos. 109,772 and 109,773 and the following compounds.

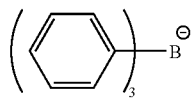 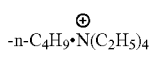

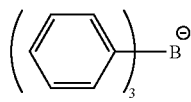 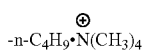

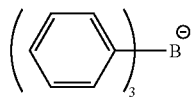 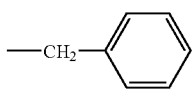 

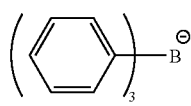 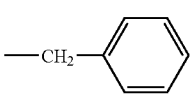 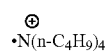

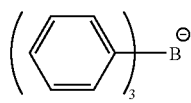

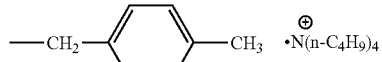 

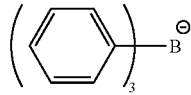

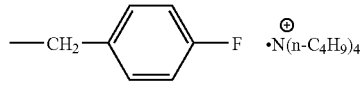 

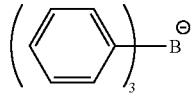

 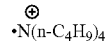

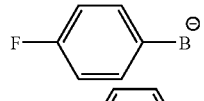 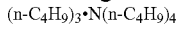

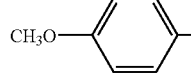 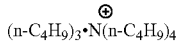

(4) Hexaaryl Biimidazoles:

This compound can generate a radical having excellent stability and high sensitivity. Specific examples thereof include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophen-yl)-4,4',5,5'-tetra(m-methoxyphenyl) biimidazole, 2,2'-bis-(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis(o-trifluoromethylphenyl)-4,4',5,5'-tetraphenyl biimidazole.

(5) Onium Salt Compounds:

Onium compounds of an element belonging to the group 15(5B), 16(6B) or 17(7B) of the periodic table, specifically, N, P, As, Sb, Bi, O, S, Se, Te, or I are an activator having excellent sensitivity. In particular, iodonium salts and sulfonium salts, especially diaryl iodonium and triaryl sulfonium salt compounds are extremely excellent from the viewpoints of both sensitivity and storage stability. These compounds can generate an acid and/or a radical, and use conditions thereof can be properly chosen and employed depending upon the intended purpose. Specific examples thereof include the following compounds.

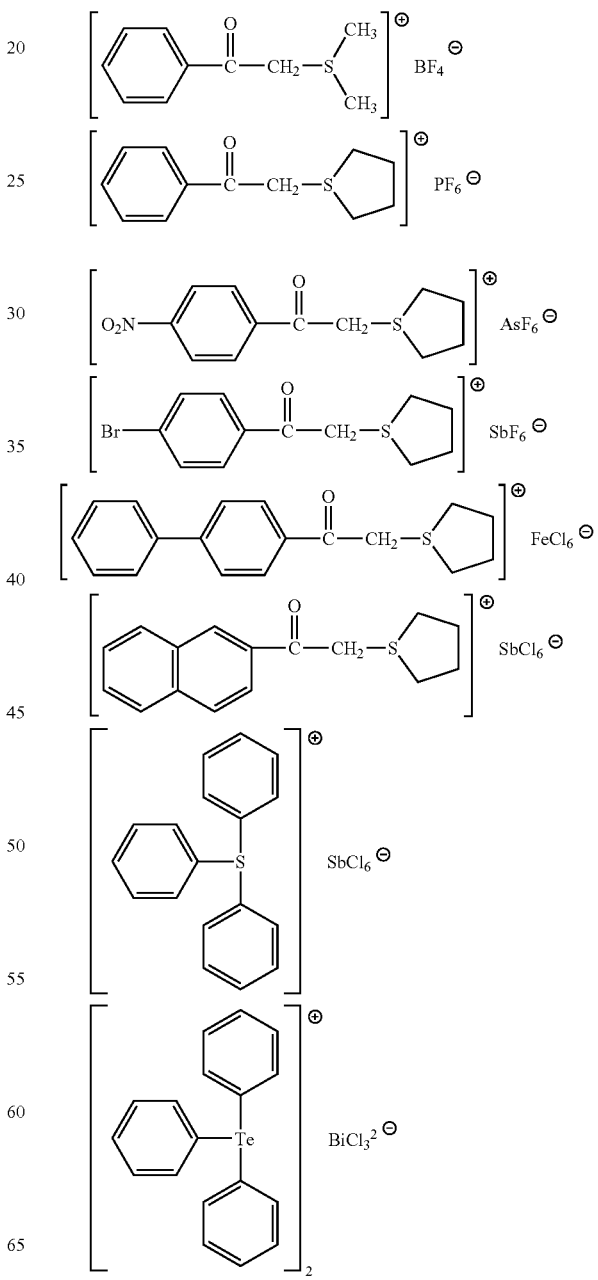

-continued

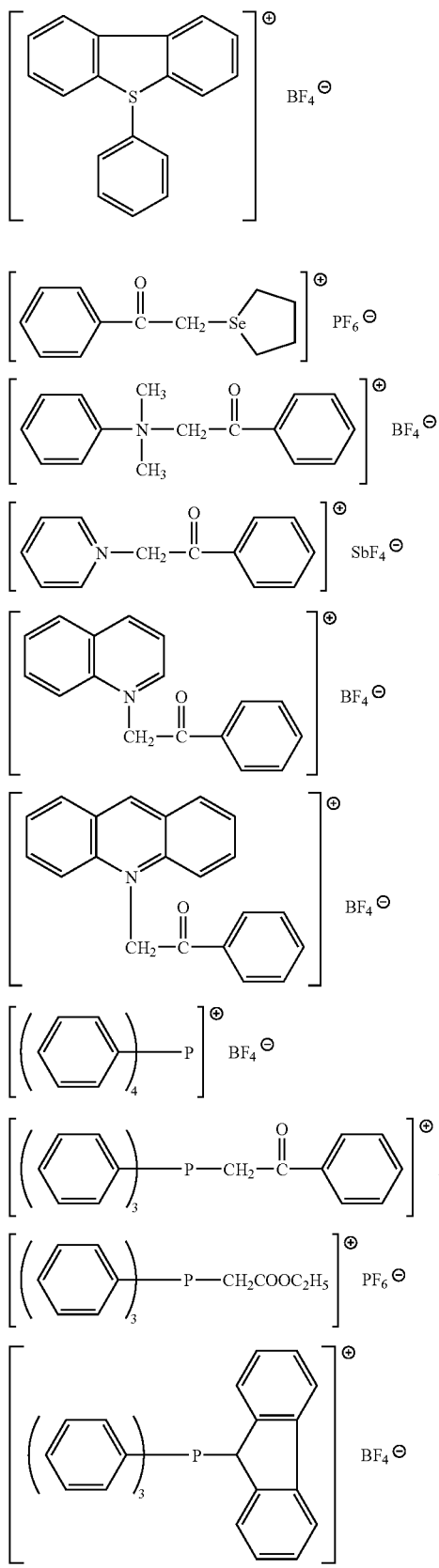

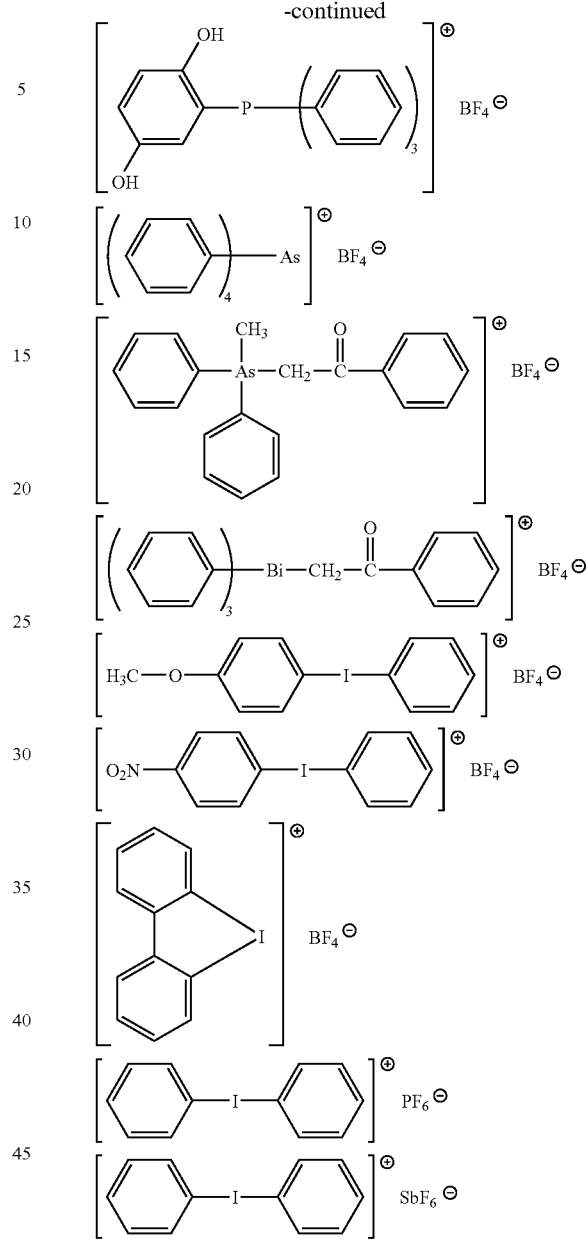

(6) Organic Peroxides:

When an activator of an organic peroxide type is used, it is possible to generate a radical as the active species with very high sensitivity.

The organic peroxide which is used in the invention includes almost all of organic compounds having at least one oxygen-oxygen bond in the molecule thereof. Examples thereof include methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy)-cyclohexane, 2,2-bis(t-butylperoxy)butane, t-butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-dimethyl-2,5-di(t-butylperoxy)hexyne-3, acetyl peroxide, isobutyryl peroxide, octanoyl peroxide, decanoyl peroxide, lauroyl peroxide, 3,5,5-trimethylhexanoyl peroxide, succinic acid peroxide, benzoyl peroxide, 2,4-dichlorobenzoyl peroxide, m-toluoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, t-butylperoxy acetate, t-butylperoxy pivalate, t-butylperoxy neodecanoate, t-butylperoxy octanoate, t-butylperoxy-3,5,5-trimethylhexanoate, t-butylperoxy laurate, t-butylperoxy benzoate, di-t-butylperoxy isophthalate, 2,5-dimethyl-2,5-di(benzoylperoxy)hexane, t-butyl permaleate, t-butylperoxyisopropyl carbonate, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di(t-butylperoxy dihydrogen diphthalate), and carbonyl di(t-hexylperoxy dihydrogen diphthalate).

Of these, peracid esters such as 3,3',4,4'-tetra(t-butyl-peroxycarbonyl)benzophenone, 3,3',4,4'-tetra(t-amylperoxycarbonyl)benzophenone, 3,3',4,4'-tetra(t-hexylperoxycarbonyl) benzophenone, 3,3',4,4'-tetra(t-octylperoxycarbonyl) benzophenone, 3,3',4,4'-tetra(cumylperoxycarbonyl) benzophenone, 3,3',4,4'-tetra-(p-isopropylcumylperoxycarbonyl)benzophenone, and di-t-butylperoxy isophthalate are preferable.

As the activator compound, titanocene compounds, hexaaryl biimidazoles and triazine compounds are preferable; and titanocene compounds are more preferable.

Likewise the preceding sensitizing dye, with respect to the activator, it is also possible to carry out a variety of chemical modifications for the purpose of improving characteristics of the photosensitive layer. For example, there can be applied methods such as coupling with the sensitizing dye, an addition polymerizable unsaturated compound and other activator part, introduction of a hydrophilic site, enhancement of compatibility, introduction of a substituent for the purpose of suppressing the deposition of crystal, introduction of a substituent for the purpose of enhancing adhesion, and polymerization.

Likewise the preceding sensitizing dye, with respect to the use method of such an activator compound, it can be arbitrarily set up by properly designing the performance of the photographic material. For example, by using two or more kinds of the activator compounds jointly, it is possible to enhance the compatibility with the photosensitive layer. In general, it is advantageous in view of the photosensitivity that the amount of the activator compound to be used is high. When the activator compound is used in an amount in the range of from 0.5 to 80 parts by weight, and preferably from 1 to 50 parts by weight based on 100 parts by weight of the photosensitive layer components, sufficient photosensitivity is obtained. On the other hand, in the case where the activator itself has absorption against visible light as in, for example, titanocene compounds, in the use under yellow or white lamp, it is preferable that the amount of the activator to be used is low in view of fogging properties due to light in the vicinity of 500 nm. However, by combining with the sensitizing dye of the invention, even when the amount of the activator compound to be used is decreased to not more than 6 parts by weight, further to not more than 1.9 parts by weight, and still further to not more than 1.4 parts by weight, it is possible to obtain sufficient photosensitivity.

(B) Polymerizable Compound which Reacts with at Least One of a Radical and an Acid:

The photosensitive composition of the invention contains, in addition to the foregoing photopolymerization initiation system, a compound which reacts with at least one of a radical and an acid to cause a change in the physical or chemical characteristics and is then held.

Specifically, such a compound is an addition polymerizable compound having at least one ethylenically unsaturated double bond. In more detail, this compound is selected from compounds having at least one, and preferably two or more terminal ethylenically unsaturated double bonds. Such compound groups are broadly known in the subject industrial field and can be used in the invention without particular limitations. Such a compound has a chemical morphology such as monomers and prepolymers, namely dimers, trimers and oligomers, or mixtures thereof, and copolymers thereof. Examples of monomers and copolymers thereof include unsaturated carboxylic acids (for example, acrylic acid methacrylic acid, itaconic acid, crotonic acid, isocrotonic acid, and maleic acid) and esters and amides thereof. Above all, esters between an unsaturated carboxylic acid and an aliphatic polyhydric alcohol and amides between an unsaturated carboxylic acid and an aliphatic polyhydric amine compound are preferably used.

Addition reaction products between an unsaturated carboxylic acid ester or amide having a nucleic substituent (for example, a hydroxyl group, an amino group, and a mercapto group) and a monofunctional or polyfunctional isocyanate or epoxy and dehydration condensation reaction products between the foregoing unsaturated carboxylic acid ester or amide and a monofunctional or polyfunctional carboxylic acid are also suitably used.

Addition reaction products between an unsaturated carboxylic acid ester or amide having an electrophilic substituent (for example, an isocyanate group and an epoxy group) and a monofunctional or polyfunctional alcohol, amine or thiol and substitution reaction products between an unsaturated carboxylic acid ester or amide having an eliminating substituent (for example, a halogen group and a tosyloxy group) and a monofunctional or polyfunctional alcohol, amine or thiol are also suitable.

Furthermore, as another example, compound groups resulting from substitution of the foregoing unsaturated carboxylic acid with an unsaturated phosphonic acid, styrene, vinyl ether, etc. can be used.

With respect to specific examples of the monomer of the ester between an aliphatic polyhydric alcohol compound and an unsaturated carboxylic acid, examples of acrylic esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers.

Examples of methacrylic esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) pheny]dimethylmethane, and bis[p-(methacryloxyethoxy) phenyl]dimethylmethane.

Examples of itaconic esters include ethylene glycol diitaconate, propylene glycol diitaconate, 1,3-butanediol diitaconate, 1,4-butanediol diitaconate, tetraethylene glycol diitaconate, pentaerythritol diitaconate, and sorbitol tetraitaconate.

Examples of crotonic esters include ethylene glycol dicrotonate, tetramethylene glycol dicrotonate, pentaerythritol dicrotonate, and sorbitol tetradicrotonate.

Examples of isocrotonic esters include ethylene glycol diisocrotonate, pentaerythritol diisocrotonate, and sorbitol tetraisocrotonate.

Examples of maleic esters include ethylene glycol dimaleate, triethylene glycol dimaleate, pentaerythritol dimaleate, and sorbitol tetramaleate.

As examples of other esters, aliphatic alcohol based esters as described in JP-B-46-27926, JP-B-51-47334, and JP-A-57-196231; esters having an aromatic based skeleton as described in JP-A-59-5240, JP-A-59-5241, and JP-A-2-226149; and amino group-containing esters as described in JP-A-1-165613 are also suitably used.

Furthermore, the foregoing ester monomers can be used as a mixture.

Specific examples of the monomer of the amide between an aliphatic polyhydric amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamdie, and xylylene bis-methacrylamide.

As other examples of the preferred amide-based monomer, ones having a cyclohexylene structure as described in JP-B-54-21726 can be enumerated.

Urethane based addition polymerizable compounds which are produced by using an addition reaction between an isocyanate and a hydroxyl group are also suitable. Specific examples thereof include vinyl urethane compounds containing two or more polymerizable vinyl groups in one molecule, which are obtainable by adding a hydroxyl group-containing vinyl monomer represented by the following formula (X) to a polyisocyanate compound containing two or more isocyanate groups in one molecule, as described in JP-B-48-41708.

CH$_2$=C(R)COOCH$_2$CH(R')OH    (X)

In the formula, R and R' each independently represents H or CH$_3$.

Urethane acrylates as described in JP-A-51-37193, JP-B-2-32293, and JP-B-2-16765; and urethane compounds having an ethylene oxide based skeleton as described in JP-B-58-49860, JP-B-56-17654, JP-B-62-39417, and JP-B-62-39418 are also suitable.

Moreover, it is possible to obtain a photopolymerizable composition having a very excellent photosensitive speed by using an addition polymerizable compound having an amino structure or a sulfide structure in the molecule thereof as described in JP-A-63-277653, JP-A-63-260909, and JP-A-1-105238.

As other examples, there can be enumerated polyester acrylates and polyfunctional acrylates or methacrylates of an epoxy acrylate obtainable by reacting an epoxy resin with (meth)acrylic acid, as described in JP-A-48-64183, JP-B-49-43191, and JP-B-52-30490. There can be also enumerated specific unsaturated compounds as described in JP-B-46-43946, JP-B-1-40337, and JP-B-1-40336; and vinyl phosphonic acid based compounds as described in JP-A-2-25493. In some case, there are suitably used structures containing a perfluoroalkyl group as described in JP-A-61-22048. Photocurable monomers and oligomers as introduced in *Journal of the Adhesion Society of Japan*, Vol. 20, No. 7, pages 300 to 308 (1984) can also be used.

With respect to these polymerizable compounds, details of the use method regarding what structure should be used, whether the polymerizable compounds should be used singly or jointly, and what addition amount should be employed can be arbitrarily set up adaptive with the design of the ultimate performance of the photographic material. For example, the polymerizable compound is chosen from the following viewpoints. With respect to the photosensitive speed, a structure having a high content of an unsaturated group per molecule is preferable, and in many cases, bifunctional or polyfunctional compounds are preferable. In the case where the polymerizable compound is used in a photosensitive layer for lithographic printing plate, for the purpose of increasing the strength of an image area, namely a cured film, trifunctional or polyfunctional compounds are preferable. Furthermore, a method for regulating both the photosensitivity and the strength by jointly using compounds having a different functionality and a different polymerizable group (for example, acrylic esters, methacrylic esters, styrene based compounds, and vinyl ether based compounds) is effective. There may be the case where while a compound having a high molecular weight or a compound having high hydrophobicity is excellent in the photosensitive speed and film strength, it is not preferable in view of the development speed and deposition in a developing solution. Furthermore, a method for choosing and using the polymerizable compound is an important factor with respect to compatibility with other components in the photosensitive layer (for example, binder polymers as described later, the foregoing photopolymerization initiator (initiation system), and coloring agents as described later) and dispersibility. For example, the compatibility is possibly enhanced by using a low-purity compound by jointly using two or more kinds of compounds. Moreover, for the purpose of enhancing adhesion to a support, an overcoat layer, etc., a specific structure may be selected.

With respect to the blending ratio of the polymerizable compound in the photosensitive layer, it is preferable in view of the sensitivity that the blending ratio is high. However, when the blending ratio is too high, there are possibly caused problems such as occurrence of undesired phase separation, problems in the production step due to tackiness of the photosensitive layer (for example, transfer of photographic material components and production failure derived from the tackiness), and deposition of the polymerizable compound from the developing solution. From these viewpoints, in many cases, the blending ratio of the polymerizable compound is from 5 to 80% by weight, and preferably from 25 to 75% by weight based on the whole of components of the composition. These polymerizable compounds may be used singly or in admixture of two or more kinds thereof. Besides, with respect to the use method of the polymerizable compound, adequate structure, blending and addition amount can be arbitrarily chosen from the viewpoints of a degree of polymerization hindrance against oxygen, a resolution, fogging properties, a change of refractive index, and surface tackiness, etc. According to circumstances, a layer construction and coating method such as undercoating and top coating may be employed.

(C) Binder Polymer:

In applying the photosensitive composition of the invention to a photosensitive layer of a lithographic printing plate precursor, an aspect of which is a preferred embodiment, it is preferable that in addition to the foregoing photopolymerization initiation system and polymerizable compound, a binder polymer is further used. It is preferred to contain a linear organic polymer as the binder. As such "linear organic polymer", any polymer may be used. Preferably, linear organic polymers which enable one to achieve water development or weakly alkaline water development and which are soluble or swelling in water or weakly alkaline water are selected.

The linear organic polymer is selected and used according to the applications not only as a film forming agent of the composition but also as water, weakly alkaline water or an organic solvent developer. For example, by using a water-soluble organic polymer, water development becomes possible. Examples of such a linear organic polymer include addition polymers having a carboxyl group in the side chain thereof, for example, ones as described in JP-A-59-44615, JP-B-54-34327, JP-B-58-12577, JP-B-54-25957, JP-A-54-92723, JP-A-59-53836, and JP-A-59-71048, namely methacrylic acid copolymers, acrylic acid copolymers, itaconic acid copolymers, crotonic acid copolymers, maleic acid copolymers, partially esterified maleic acid copolymers, and the like. Similarly, acidic cellulose derivatives having a carboxyl group in the side chain thereof can be enumerated. Besides, ones obtained by adding a cyclic acid anhydride to an addition polymer having a hydroxyl group are useful.

Of these, copolymers of [benzyl (meth)acrylate/(meth)acrylic acid/optionally other addition polymerizable vinyl monomer] and copolymers of [allyl (meth)acrylate/(meth)acrylic acid/optionally other addition polymerizable vinyl monomer] are especially suitable because they are excellent in balance among the film strength, the sensitivity and the developability.

Furthermore, acid group-containing urethane based binder polymers as described in JP-B-7-120040, JP-B-7-120041, JP-B-7-120042, JP-B-8-12424, JP-A-63-287944, JP-A-63-287947, JP-A-1-271741, and JP-A-2001-312062 are advantageous in view of printing resistance and low-exposure aptitude because they are every excellent in strength. Moreover, amide group-containing binders as described in JP-A-11-171907 are suitable because they have both excellent developability and film strength.

Additionally, polyvinylpyrrolidone, polyethylene oxide, and the like are useful as the water-soluble linear organic polymer. For the purpose of increasing the strength of the cured film, alcohol-soluble nylons, polyethers between 2,2-bis-(4-hydroxyphenyl)-propane and epichlorohydrin, and the like are also useful. Such a linear organic polymer can be mixed in an arbitrary amount in the entire composition. However, when the amount of the linear organic polymer exceeds 90% by weight, there are not given preferred results from the standpoints of the strength of an image to be formed and the like. The amount is preferably from 30 to 85% by weight. Furthermore, it is preferable that a weight ratio of the photopolymerizable ethylenically unsaturated double bond-containing compound to the linear organic polymer is in the range of from 1/9 to 7/3. In a preferred embodiment, a binder polymer which is substantially insoluble in water and soluble in alkalis is used. In this way, it is possible to use a developing solution free from an organic solvent which is not preferred from the environmental standpoint, or to limit the amount of an organic solvent to a very small level. In such a use method, an acid value of the binder polymer (the content of an acid per gram of the polymer as expressed in terms of the chemical equivalent number) and a molecular weight of the binder polymer are properly selected from the viewpoints of image strength and developability. Preferably, the acid value is in the range of from 0.4 to 3.0 meq/g, and the molecular weight is in the range of from 3,000 to 500,000. More preferably, the acid value is in the range of from 0.6 to 2.0 meq/g, and the molecular weight is in the range of from 10,000 to 300,000.

(D) Other Components:

In using the photosensitive composition of the invention as a photosensitive layer of an image recording material such as lithographic printing plate precursors, other components suitable for the application, production method, and the like can be further properly added.

Preferred additives will be enumerated below.

(D1) Cosensitizer:

By using a certain kind of an additive (hereinafter referred to as "cosensitizer"), it is possible to further enhance the sensitivity of the photosensitive layer. While these action mechanisms thereof are not always elucidated yet, it may be considered that the majority thereof is based on the following chemical process. That is, it is assumed that a variety of intermediate active species (for example, radicals, peroxides, oxidizing agents, and reducing agents) as generated during the photoreaction which is started due to light absorption of the foregoing photopolymerization initiation system and the subsequently occurred addition polymerization reaction react with the cosensitizer to generate a new active radical. The cosensitizer is roughly classified into (a) a compound capable of generating an active radical upon reduction, (b) a compound capable of generating an active radical upon oxidation, and (c) a compound which reacts with a radical having low activity, whereby it is converted into a radical having higher activity or acts as a chain transfer agent. However, in many case, there is no commonly accepted theory on what class the individual compound belongs to.

(a) Compound Capable of Generating an Active Radical Upon Reduction:

Compounds having a carbon-halogen bond: It is considered that a carbon-halogen bond is reductively cleaved to generate an active radical. Specifically, for example, trihalomethyl-s-triazines and trihalomethyl oxadiazoles are suitably used.

Compounds having a nitrogen-nitrogen bond: It is considered that a nitrogen-nitrogen bond is reductively cleaved to generate an active radical. Specifically, for example, hexaaryl biimidazoles are suitably used.

Compounds having an oxygen-oxygen bond: It is considered that an oxygen-oxygen bond is reductively cleaved to generate an active radical. Specifically, for example, organic peroxides are suitably used.

Onium compounds. It is considered that a nitrogen-hetero bond or an oxygen-nitrogen bond is reductively cleaved to generate an active radical. Specifically, for example, diaryl iodonium salts, triaryl sulfonium salts, and N-alkoxypyridium (azinium) salts are suitably used.

Ferrocene and iron-allene complexes: An active radical can be reductively generated.

(b) Compound Capable of Generating an Active Radical Upon Oxidation:

Alkylate complexes: It is considered that a carbon-hetero bond is oxidatively cleaved to generate an active radical. Specifically, for example, triarylalkyl borates are suitably used.

Alkylamine compounds: It is considered that a C—X bond on the carbon adjacent to nitrogen is cleaved due to oxidation to generate an active radical. X is suitably a hydrogen atom, a carboxyl group, a trimethylsilyl group, a benzyl group, etc. Specific examples of the alkylamine compound include ethanolamines, N-phenylglycines, and N-trimethylsilylmethylanilines.

Sulfur-containing and tin-containing compounds: Ones resulting from substitution of the nitrogen atom of the foregoing amine with a sulfur atom or a tin atom can generate an active radical due to a similar action. It is also known that a compound having an S—S bond causes sensitization due to S—S cleavage.

α-Substituted methylcarbonyl compounds: An active radical can be generated due to bond cleavage between carbonyl and α-carbon upon oxidation. Ones resulting from conversion of the carbonyl into oxime ether exhibit a similar action. Specific examples of the compound include 2-alkyl-1-[4-(alkylthio)phenyl]-2-morpholinopropanone-1 compounds and oxime ethers obtained by reacting such a compound with a hydroxylamine and then etherifying the N—OH.

Sulfinic acid salts: An active radical can be reductively generated. Specific examples thereof include sodium arylsulfinates.

(c) Compound which Reacts with a Radical Having Low Activity, Whereby it is Converted into a Radical Having Higher Activity or Acts as a Chain Transfer Agent:

For example, compound groups having SH, PH, SiH, or GeH in the molecule thereof are used. These compounds can generate a radical by providing hydrogen to a radical species having low activity, or can generate a radical upon oxidation and then proton elimination. Specifically, there are enumerated 2-mercaptobenzimidazoles.

A number of more specific examples of the cosensitizer are described as additives for the purpose of enhancing the sensitivity in, for example, JP-A-9-236913. A part of such specific examples will be given below, but it should not be construed that the invention is limited thereto.

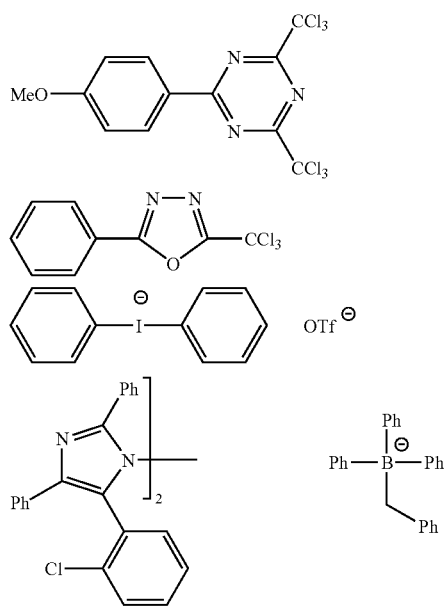

-continued

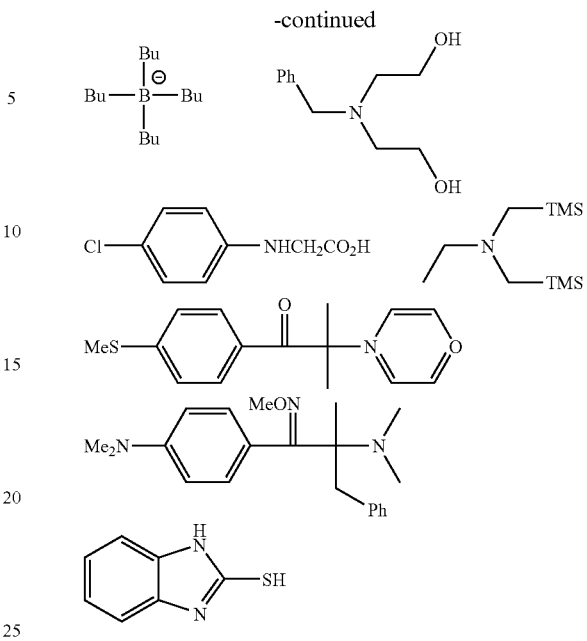

Likewise the preceding sensitizing dye, with respect to the cosensitizer, it is also possible to carry out various chemical modifications for the purpose of further improving characteristics of the photosensitive layer of the lithographic printing plate precursor. For example, there can be applied methods such as coupling with the sensitizing dye or titanocene, an addition polymerizable unsaturated compound and other radical generating part, introduction of a hydrophilic site, enhancement of compatibility, introduction of a substituent for the purpose of suppressing the deposition of crystal, introduction of a substituent for the purpose of enhancing adhesion, and polymerization. The cosensitizer can be used singly or in combination of two or more kinds thereof. An amount of the cosensitizer to be used is in the range of from 0.05 to 100 parts by weight, preferably from 1 to 80 parts by weight, and more preferably from 3 to 50 parts based on 100 parts by weight of the ethylenically unsaturated double bond-containing compound.

(D2) Thermal Polymerization Inhibitor:

In addition to the foregoing basic components, it is desired to add a small amount of a thermal polymerization inhibitor in the photosensitive composition of the invention during the production or storage for the purpose of preventing unnecessary thermal polymerization of the polymerizable ethylenically unsaturated double bond-containing compound from occurring. Examples of a suitable thermal polymerization inhibitor include hydroquinone, p-methoxyphenyl, di-t-butyl-p-cresol, pyrogallol, t-butyl chatecol, benzoquinone, 4,4'-thiobis(3-methyl-6-t-butylphenyl), 2,2'-methylenebis-(4-methyl-6-t-butylphenol), and N-nitrosophenylhydroxylamine cerous salt. An amount of the thermal polymerization inhibitor to be added is preferably from about 0.01% by weight to about 5% by weight based on the weight of the entire composition. Furthermore, in the case where the photosensitive composition of the invention is coated as a photo-sensitive layer of a lithographic printing plate precursor, etc., if desired, for the purpose of preventing polymerization hindrance due to oxygen, a higher fatty acid derivative such as behenic acid and behenic amide may be added, thereby unevenly distributing it on the surface of the photosensitive layer during a drying step to be carried out after coating. An amount of the higher fatty acid derivative to be added is preferably from about 0.5% by weight to about 10% by weight of the entire composition.

(D3) Coloring Agent, etc.:

In the case where the photosensitive composition of the invention is used as a photosensitive layer of an image recording material such as a lithographic printing plate precursor, a coloring agent such as dyes and pigments may be further added for the purpose of coloring the photosensitive layer. In this way, it is possible to enhance so-called plate inspection properties such as visibility after plate making and aptitude to image density analyzers.

It is especially preferred to use a pigment as the coloring agent because the major part of dyes cause a reduction of the sensitivity of the photosensitive layer of the photopolymerization system. Specific examples of the coloring agent include pigments (for example, phthalocyanine based pigments, azo based pigments, carbon black, and titanium oxide) and dyes (for example, Ethyl Violet, Crystal Violet, azo based dyes, anthracene based dyes, and cyanine based dyes). An amount of the dye or pigment to be added in preferably from about 0.5% by weight to about 5% by weight of the entire composition.

(D4) Other Additives:

In the case where the photosensitive composition of the invention is used in a photosensitive layer of a lithographic printing plate precursor, etc., known additives such as inorganic fillers for the purpose of improving physical properties of the cured film and besides, a plasticizer and a sensitizing agent capable of enhancing inking properties on the surface of the photosensitive layer may be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetyl glycerin. When a binder polymer is used, it can be added in an amount of not more than 10% by weight based on the total weight of the ethylenically unsaturated double bond-containing compound and the binder polymer.

In order to strength heating and exposure effects after the development for the purpose of enhancing the film strength (printing resistance) of a photosensitive layer of a lithographic printing plate precursor as described later, it is also possible to add UV initiators, thermal crosslinking agents, and the like.

Besides, it is possible to add an additive or provide an interlayer for the purpose of enhancing the adhesion of the photosensitive layer to the support or increasing development eliminating properties of an unexposed photosensitive layer. For example, by adding or undercoating a compound having a relatively strong mutual action with a substrate as described later, such as compounds having a diazonium structure and phosphonic compounds, it is possible to enhance the adhesion or increase the printing resistance. On the other hand, by adding or undercoating a hydrophilic polymer such as polyacrylic acid and polysulfonic acid, it is possible to enhance developability of an non-image area or enhance staining properties.

In coating the photosensitive composition of the invention as a photosensitive layer of an image recording material such as a lithographic printing plate precursor on a support, it is dissolved in a variety of organic solvents and then provided for use. Examples of the solvent which is used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxyethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used singly or in admixture. A concentration of solids in the coating solution is suitably from 2 to 50% by weight.

The coating amount of the photosensitive layer on the support possibly influences mainly sensitivity of the photosensitive layer, developability, and strength and printing resistance of the exposed film. It is desired that the coating amount is adequately chosen depending upon the application. When the coating amount is too low, the printing resistance becomes insufficient. On the other hand, when it is too high, not only the sensitivity is lowered and it takes a long period of time for the exposure, but also it takes a longer period of time for the development treatment, and therefore, such is not preferable. For a lithographic printing plate for scan exposure which is the major purpose for use of the photosensitive composition of the invention, the coating amount is suitably in the range of from about 0.1 $g/m^2$ to about 10 $g/m^2$ in terms of the weight after drying. The coating amount is more preferably from 0.5 to 5 $g/m^2$.

(E) Support:

In order to obtain a lithographic printing plate precursor which is one of the major purpose for use of the photosensitive composition of the invention, it is desired to provide a photosensitive layer made of the photosensitive composition on a support whose surface is hydrophilic. As the hydrophilic support, conventionally known hydrophilic supports which are useful in lithographic printing plate precursors can be used without limitations.

It is preferable that the support to be used is a dimensionally stable plate-like material. Examples of the support include papers, papers laminated with a plastic (for example, polyethylene, polypropylene, and polystyrene), metal plates (for example, aluminum, zinc, and copper), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonates, and polyvinyl acetal), and papers or plastic films having the foregoing metal laminated or vapor deposited thereon. If desired, the surface of such a support may be subjected to a proper known physical or chemical treatment for the purposes of imparting hydrophilicity and enhancing the strength.

In particular, as the preferred support, there are enumerated papers, polyester films, and aluminum plates. Above all, aluminum plates which have good dimensional stability, are relatively cheap and can provide a surface having excellent hydrophilicity and strength by a surface treatment as the need arises are especially preferable. Furthermore, a composite sheet having an aluminum sheet coupled on a polyethylene terephthalate film as described in JP-B-48-18327 is also preferable.

Examples of the preferred aluminum plate include pure aluminum plates and alloy plates containing aluminum as the major component and a slight amount of foreign elements.

Plastic films having aluminum laminated or vapor deposited thereon are also employable. Examples of foreign elements which are contained in aluminum alloys include silicon, iron, manganese, copper, magnesium, chromium, zinc, bismuth, nickel, and titanium. The content of foreign elements in the alloy is at most 10% by weight. While the aluminum which is especially suitable in the invention is pure aluminum, since it is difficult to produce completely pure aluminum according to the smelting technology, a slight amount of foreign elements may be contained. With respect to the aluminum plate which is applied in the invention in this way, its composition is not specified, and aluminum plates made of a raw material which has hitherto been publicly known and used can be properly utilized. The aluminum plate which is used in the invention is from about 0.1 mm to 0.6 mm, preferably from 0.15 mm to 0.4 mm, and especially preferably from 0.2 mm to 0.3 mm.

Moreover, in the case of a support having a surface of a metal, particularly aluminum, it is preferable that the support is subjected to a surface treatment such as a roughing (sand blasting) treatment, a dipping treatment in an aqueous solution of sodium silicate, potassium fluorozirconate, a phosphate, etc., and an anodic oxidation treatment.

The roughing treatment of the surface of the aluminum plate is carried out by a variety of methods. For example, the roughing treatment is carried out by a method for mechanically roughing the surface, a method for electrochemically dissolving and roughing the surface, or a method for selectively chemically dissolving the surface. As the mechanical method, there can be employed known methods such as a ball polishing method, a brush polishing method, a blast polishing method, and a buff polishing method. As the electrochemical roughing method, there is enumerated a method in which roughing is carried out in an electrolyic solution of hydrochloric acid, nitric acid, etc. by an alternating current or a direct current. A combination of both of these methods as disclosed in JP-A-54-63902 can also be utilized. Prior to roughing the aluminum plate, if desired, in order to remove a rolling oil on the surface, for example, a degreasing treatment with a surfactant, an organic solvent, an alkaline aqueous solution, etc. is carried out.

Moreover, an aluminum plate which after roughing, has been subjected to a dip treatment with a sodium silicate aqueous solution can be preferably used. An aluminum plate which after performing an anodic oxidation treatment, has been subjected to a dip treatment with an aqueous solution of an alkali metal silicate as described in JP-B-47-5125 is suitably used. The anodic oxidation treatment is carried out by, for example, passing an electric current in an electrolytic solution composed of an aqueous solution or non-aqueous solution of an inorganic acid (for example, phosphoric acid, chromic acid, sulfuric acid, and boric acid) or an organic acid (for example, oxalic acid and sulfamic acid) or a salt thereof singly or in combination of two or more kinds thereof while using an aluminum plate as an anode.

Silicate electrodeposition as described in U.S. Pat. No. 3,658,662 is also effective.

Moreover, a surface treatment combining a support which has been subjected to electrograining with the foregoing anodic oxidation treatment and sodium silicate treatment as described in JP-B-46-27481, JP-A-52-58602, and JP-A-52-30503 is effective.

Still furthermore, a surface treatment for successively carrying out mechanical roughing, chemical etching, electrograining, anodic oxidation treatment, and sodium silicate treatment as disclosed in JP-A-56-28893 is suitable.

Moreover, after the foregoing treatments, a treatment for undercoating a water-soluble resin (for example, polyvinyl sulfonic acid, polymers or copolymers having a sulfonic group in the side chain thereof, and polyacrylic acid), a water-soluble metal salt (for example, zinc borate), a yellow dye, an amine salt, etc. is suitable.

Moreover, a sol-gel treated substrate which has been subjected to covalent bonding with a functional group capable of causing an addition reaction by a radical as disclosed in JP-A-7-159983 is suitably used.

As other preferred examples, there can be enumerated ones in which a waterproof hydrophilic layer is provided as a surface layer on an arbitrary support. Examples of such a surface layer include layers comprising an inorganic pigment and a binder as described in U.S. Pat. No. 3,055,295 and JP-A-56-13168, hydrophilic swelling layers as described in JP-A-9-80744, and sol-gel films comprising titanium oxide, polyvinyl alcohol, and a silicic acid as described in JP-T-8-507727.

Such a hydrophilic treatment is carried out for the purposes of making the surface of the support hydrophilic and besides, preventing a harmful reaction of the photosensitive composition to be provided thereon and enhancing adhesion of the photosensitive layer.

(F) Protective Layer:

In a lithographic printing plate for scan exposure, an aspect of which is a preferred embodiment for use of the photosensitive composition of the invention, since the exposure is usually carried out in the air, it is preferred to further provide a protective layer on the layer made of the photosensitive composition.

The protective layer prevents mingling of low molecular compounds (for example, oxygen and basic substances) present in the air, which likely hinder the image forming reaction as generated by exposure in the photosensitive layer, into the photosensitive layer from occurring, thereby making it possible to achieve exposure in the air. Accordingly, the protective layer is desired to have such characteristics that it has low permeability of low molecular compounds such as oxygen; that it does not substantially hinder transmission of light to be used for exposure; that it has excellent adhesion to the photosensitive layer; and that it can be easily removed in a development step after exposure. Devices regarding such a protective layer have hitherto been made, and details thereof are described in U.S. Pat. No. 3,458,311 and JP-A-55-49729.

As materials which can be used in the protective layer, for example, water-soluble high molecular compounds having relatively excellent crystallinity can be used. Specifically, there are known water-soluble polymers such as polyvinyl alcohol, polyvinylpyrrolidone, acidic celluloses, gelatin, gum arabic, and polyacrylic acid. Above all, what polyvinyl alcohol is used as the major component brings the most satisfactory results in view of basic characteristics such as oxygen-blocking properties and development eliminating properties. With respect to the polyvinyl alcohol which is used in the protective layer, so far as an unsubstituted vinyl alcohol unit for having necessary oxygen-blocking properties and water solubility is contained, a part thereof may be substituted with an ester, an ether or an acetal. Similarly, a part of the polyvinyl alcohol may have other copolymerization component. As specific examples, there can be enumerated polyvinyl alcohols which are hydrolyzed to an extent of from 71 to 100% and which have a molecular weight in the range of from 300 to 2,400.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8, all of which are manufactured by Kuraray Co., Ltd.

Components (selection of PVA and use of an additive) and coating amount of the protective layer and the like are chosen while taking into consideration oxygen-blocking properties and development eliminating properties and besides, fogging properties, adhesion and scratch resistance. In general, the higher the degree of hydrolysis of PVA to be used (the higher the content of the unsubstituted vinyl alcohol unit in the protective layer) or the thicker the film thickness, the higher the oxygen-blocking properties, and such is advantageous in view of the sensitivity. However, when the oxygen-blocking properties are extremely increased, an unnecessary polymerization reaction likely occurs at the time of production and at the time of unprocessed stock storage. Also, there is caused a problem that unnecessary fog or thickening of image lines is caused at the time of image exposure. Also, adhesion to an image area and scratch resistance are extremely important in handling a plate. That is, when a hydrophilic layer made of a water-soluble polymer is laminated on a lipophilic polymer layer, film separation likely occurs due to a shortage of adhesive strength, and the separated portion causes defects such as inferior film hardening due to polymerization hindrance of oxygen.

In contrast, there have been made various proposals for the purpose of improving adhesion between these two layers. For example, by mixing an acrylic emulsion, a water-insoluble polyvinylpyrrolidone-vinyl acetate copolymer, etc. in an amount of from 20 to 60% by weight in a hydrophilic polymer made of polyvinyl alcohol and laminating the mixture on the polymer layer, sufficient adhesion is obtained. For the protective layer in the invention, any of these known technologies can be applied. The coating method of such a protective layer is described in detail in, for example, U.S. Pat. No. 3,458,311 and JP-A-55-49729.

Moreover, it is possible to impart other function to the protective layer. For example, by adding a coloring agent to be used for exposure (for example, water-soluble dyes), which is excellent in transmission against light of from 350 nm to 450 nm and which can efficiently absorb light of 500 nm or more, it is possible to further increase safelight aptitude without causing a reduction of the sensitivity.

In using a photosensitive material using the photosensitive composition of the invention as an image recording material such as a lithographic printing plate precursor, in general, after image exposure, an unexposed area of the photosensitive layer is removed by a developing solution to obtain an image. In using such a photosensitive composition in a lithographic printing plate precursor, examples of the preferred developing solution include developing solutions as described in JP-B-57-7427. Suitable examples thereof include aqueous solutions of an inorganic alkaline agent (for example, sodium silicate, potassium silicate, sodium hydroxide, potassium hydroxide, lithium hydroxide, sodium triphosphate, sodium diphosphate, ammonium triphosphate, ammonium diphosphate, sodium metasilicate, sodium bicarbonate, and ammonia water) and aqueous solutions of an organic alkaline agent (for example, monoethanolamine and diethanolamine). A concentration of such an alkaline solution is from 0.1 to 10% by weight, and preferably from 0.5 to 5% by weight.

Furthermore, such an alkaline aqueous solution can contain a small amount of a surfactant or an organic solvent (for example, benzyl alcohol, 2-phenoxyethanol, and 2-butoxyethanol) as the need arises. For example, there can be enumerated ones as described in U.S. Pat. Nos. 3,375,171 and 3,615,480. Moreover, developing solutions as described in JP-A-50-26601, JP-A-58-54341, JP-B-56-39464, and JP-B-56-42860 are also excellent.

As the especially preferred developing solution, there is enumerated a developing solution containing a nonionic compound represented by the following formula and having a pH of from 11.5 to 12.8 and a conductivity of from 3 to 30 mS/cm.

$$A\text{-}W$$

In the formula, A represents a hydrophobic organic group having a Log P of A-H of 1.5 or more; and W represents a nonionic hydrophilic organic group having a Log P of W—H of less than 1.0.

Besides, as a plate making process of a lithographic printing plate from a lithographic printing plate precursor using the photosensitive composition of the invention in a photosensitive layer thereof, the entire surface may be heated before exposure, during exposure or in the course of from exposure to development as the need arises. By such heating, the image forming reaction in the photosensitive layer is promoted, thereby giving rise to advantages such as enhancement of the sensitivity and printing resistance and stabilization of the sensitivity. Moreover, for the purpose of enhancing the image strength and printing resistance, it is also effective to carry out entire post-heating or entire exposure of an image after the development. Usually, it is preferable that the heating before the development is carried out under a mild condition at not higher than 150° C. When the temperature is too high, there is caused such a problem that even a non-image area is fogged. For the heating after the development, a very strong condition is applied. Usually, the heating after the development is carried out at a temperature in the range of from 200 to 500° C. When the temperature is too low, a sufficient image strengthening action is not obtained, while when it is too high, there are caused problems such as deterioration of the support and thermal decomposition of an image area.

With respect to the exposure method of a lithographic printing plate precursor using the photosensitive composition of the invention in a photosensitive layer thereof, known methods can be employed without limitations. A desired wavelength of the light source is from 350 nm to 450 nm, and specifically, an InGaN based semiconductor laser is suitable. With respect to the exposure mechanism, any of an internal drum system, an external drum system, a flat bed system, and so on may be employed. Furthermore, when a highly water-soluble material is used as the photosensitive layer component, it is possible to make the material soluble in neutral water or weakly alkaline water. There is also employable a system in which after mounting a lithographic printing plate precursor having such a construction on a printing machine, exposure and development are carried out on the machine.

As other exposure light sources for the photopolymerizable composition according to the invention, there can be employed various mercury vapor lamps (for example, an extra-high pressure mercury vapor lamp, a high pressure mercury vapor lamp, a medium pressure mercury vapor lamp, and a low pressure mercury vapor lamp), chemical lamps, carbon arc lamps, xenon lamps, metal halide lamps, various laser lamps (for example, visible laser lamps and ultraviolet laser lamps), fluorescent lamps, tungsten lamps, and sunlight.

As available laser light sources of from 350 nm to 450 nm, the following can be employed.

Examples of gas lasers include an Ar ion laser (364 nm, 351 nm, 10 mW to 1 W), a Kr ion laser (356 nm, 351 nm, 10 mW to 1 W), and an He—Cd laser (441 nm, 325 nm, 1 mW to 100 mW); and examples of solid lasers include a combination of {Nd:YAG(YVO$_4$) and SHG crystal}×2 (355 nm, 5 mW to 1 W) and a combination of Cr:LiSAF and SHG crystal (430 nm, 10 mW).

Examples of semiconductor laser systems include a KNbO$_3$ ring resonator (430 nm, 30 mW), a combination of a waveguide type wavelength converting element and AlGaAs and InGaAs semiconductors (380 nm to 450 nm, 5 mW to 100 mW), a combination of a waveguide type wavelength converting element and AlGaInP and AlGaAs semiconductors (300 nm to 350 nm, 5 mW to 100 mW), and an AlGaInN semiconductor laser (350 nm to 450 nm, 5 mW to 30 mW); and besides, examples of pulse lasers include an N$_2$ laser (337 nm, pulse: 0.1 to 10 mJ) and XeF (351 nm, pulse: 10 to 250 mJ). Of these, an AlGaInN semiconductor laser (commercially available InGaN based semiconductor laser: 400 nm to 410 nm, 5 to 30 mW) is suitable in view of wavelength characteristics and costs.

As an exposure device of lithographic printing plate of the scan exposure system, examples of the exposure mechanism include an internal drum system, an external drum system, and a flat bed system. As a light source, among the foregoing light sources, ones which can achieve continuous oscillation can be preferably applied. Actually, the following exposure devices are especially preferable with respect to the relationship between the sensitivity of the photographic material and the plate making time.

An exposure device of single beam to triple beams using at least one gas laser or solid laser light source according to an internal drum system such that the total output becomes 20 mW or more.

An exposure device of multi-beams (one to ten) using at least one of a semiconductor laser, a gas laser and a solid laser according to the flat bed system such that the total output becomes 20 mW or more.

An exposure device of multi-beams (one to ten) using at least one of a semiconductor laser, a gas laser and a solid laser according to the external drum system such that the total output becomes 20 mW or more.

An exposure device of multi-beams (ten or more) using at least one of a semiconductor laser and a solid laser according to the external drum system such that the total output becomes 20 mW or more.

In the foregoing laser direct drawing type lithographic printing plates, in general, the following equation (eq 1) is valid among the sensitivity X of photographic material (J/cm$^2$), the exposed area S of photographic material (cm$^2$), the power q per one laser light source (W), the number n of lasers, and the entire exposure time t (s).

$$X \cdot S = n \cdot q \cdot t \qquad (\text{eq 1})$$

i) Case of an Internal Drum (Single Beam) System:

In general, the following equation (eq 2) is valid among the revolution number f of laser (radian/s), the sub-scanning length Lx of photographic material (cm), the resolution Z (dots/cm), and the entire exposure time t (s).

$$f \cdot Z \cdot t = Lx \qquad (\text{eq 2})$$

ii) Case of an External Drum (Multi-Beam) System:

In general, the following equation (eq 3) is valid among the revolution number F of drum (radian/s), the sub-scanning length Lx of photographic material (cm), the resolution Z (dots/cm), the entire exposure time t (s), and the number n of beams.

$$F \cdot Z \cdot n \cdot t = Lx \qquad (\text{eq 3})$$

iii) Case of a Flat Bead (Multi-Beam) System:

In general, the following equation (eq 4) is valid among the revolution number H of polygon mirror (radian/s), the sub-scanning length Lx of photographic material (cm), the resolution Z (dots/cm), the entire exposure time t (s), and the number n of beams.

$$F \cdot Z \cdot n \cdot t = Lx \qquad (\text{eq 4})$$

By substituting the exposure conditions of a resolution as required in an actual printing plate (2,560 dpi), a plate size (A1/B1, sub-scanning length: 42 inches) and about 20 sheets per hour and the photosensitive characteristics of the photosensitive composition of the invention (photosensitive wavelength and sensitivity: about 0.1 mJ/cm$^2$) in the foregoing respective equations, it can be understood that in a photographic material using the photosensitive composition of the invention, a combination with the multi-beam exposure system using a laser having a total output of 20 mW or more is especially preferable. Moreover, by further taking into consideration the operability, costs, etc., it is noted that a combination with a semiconductor laser multi-beam (ten or more) exposure device of an external drum system is the most preferable.

Furthermore, with respect to the utility of the photosensitive composition of the invention, besides the utility as a lithographic printing plate for scan exposure, it can be widely applied to ones known as utilities of photocurable resins without limitations. For example, by applying to a photopolymerizable composition in a liquid state which is optionally used jointly with a cationic polymerizable compound, a photofabrication material with high sensitivity is obtained. Furthermore, by utilizing a change of the refractive index which is caused following photopolymerization, a hologram material can be obtained. By utilizing a change of tackiness of the surface which is caused following photopolymerization, the photosensitive composition of the invention can be applied to a variety of transfer materials (for example, peel-apart photographic materials and toner-developing photographic materials). The photosensitive composition of the invention can be also applied to photocuring of microcapsules. The photosensitive composition of the invention can be further applied for the production of electronic materials such as photoresists and as inks and paints, and photocurable resin materials such as adhesives.

Moreover, the photopolymerization initiation system composed of an acridine compound and an activator compound, which is contained in the photosensitive composition of the invention, is a photopolymerization initiation system having excellent photosensitivity and excellent stability and can be used for various application methods other than the photosensitive composition. For example, the generation of a radical with high efficiency by light can cause oxidative color development of a triphenylmethane based leuco dye with high sensitivity. It can also cause a discoloration reaction due to the addition of a radical. Furthermore, the photopolymerization initiation system generates not only a radical but also an acid component simultaneously by light. Accordingly, by combining it with a compound whose absorption is varied by an acid, a resin composition capable of causing a crosslinking reaction by an acid, or a resin composition which is decomposed by an acid, whereby the solubility can be enhanced, it is possible to prepare an image forming material with high sensitivity.

EXAMPLES

The invention will be described below with reference to the following Examples, but it should not be construed that the invention is limited to these Examples.

Examples 1 to 11 and Comparative Examples 1 to 6

(Preparation of Support)

An aluminum plate having a thickness of 0.3 mm was dipped in and etched with 10% by weight sodium hydroxide at 60° C. for 25 seconds, washed with running water, neutralized and washed with 20% by weight nitric acid, and then washed with water. The aluminum plate was subjected to an electrolytic roughing treatment in a quantity of electricity at the time of anode of 300 coulombs/dm$^2$ in a 1% by weight nitric acid aqueous solution using an alternating waveform current of sine wave. Subsequently, the resulting aluminum plate was dipped in a 1% by weight sodium hydroxide aqueous solution at 40° C. for 5 seconds and then dipped in a 30% by weight sulfuric acid aqueous solution, subjected to desmutting at 60° C. for 40 seconds, and then subjected to an anodic oxidation treatment in a 20% by weight sulfuric acid aqueous solution at a current density of 2 A/dm$^2$ for 2 minutes such that an anodically oxidized film had a thickness of 2.7 g/m$^2$. A surface roughness thereof was measured and found to be 0.3 μm (in terms of an Ra expression according to JIS B0601).

The following sol-gel reaction solution was coated on the back surface of the thus treated substrate using a bar coater and dried at 100° C. for one minute, thereby preparing a support provided with a backcoat layer having a coating amount after drying of 70 mg/m$^2$.

Sol-Gel Reaction Solution:

| | |
|---|---|
| Tetraethyl silicate: | 55 parts by weight |
| Water: | 25 parts by weight |
| Methanol: | 10 parts by weight |
| Phosphoric acid: | 0.05 parts by weight |

The foregoing components were mixed and stirred. About 5 minutes later, heat generation started. After reacting for 60 minutes, the following solution was added to prepare a backcoat coating solution.

| | |
|---|---|
| Pyrogallol-formaldehyde condensed resin (molecular weight: 2,000): | 6 parts by weight |
| Dimethyl phthalate: | 6 parts by weight |
| Fluorine based surfactant (N-butyl perfluorooctanesulfonamide ethyl acrylate/polyoxyethylene acrylate copolymer, molecular weight: 20,000): | 0.7 parts by weight |
| Methanol silica gel (manufactured by Nissan Chemical Industries, Ltd., 30% by weight in methanol): | 50 parts by weight |
| Methanol: | 800 parts by weight |

(Preparation of Photosensitive Layer)

A photopolymerizable composition having the following composition was coated on the thus treated aluminum plate such that a coating amount after drying was 1.0 g/m$^2$ and then dried at 80° C. for 2 minutes, thereby forming a photosensitive layer.

| | |
|---|---|
| Addition polymerizable compound U-4H: 3-(2-Methylprop-2-enoyloxy)-2-(N-(6-((2-methylprop-2-enoyloxy)-1-((2-methylprop-2-enoyloxy)methyl)ethoxy)carbonylamino)hexyl)-carbamoyloxy)propyl-2-methylprop-2-enoate | 1.5 g |
| Polyurethane resin as a polycondensate of the following diisocyanates and diols: | 1.8 g |

4,4'-Diphenylmethane diisocyanate (MDI)
Hexamethylene diisocyanate (HMDI)
Polypropylene glycol, weight average molecular weight: 1,000 (PPG1000)
2,2-Bis(hydroxymethyl)propionic acid (DMPA)
Tetraethylene glycol (TEG)
    Copolymerization ratio (MDI/HMDI/PPG1000/DMPA/TEG)=38/12/15/25/10
    Measured acid value as determined by NaOH titration: 1.08 meq/g
    Weight average molecular weight as determined by GPC measurement: 52,000

Photopolymerization initiation system (as described in Table 1)
Sensitizing dye
Activator compound (titanoecene compound)
Cosensitizer

| | |
|---|---|
| Fluorine based nonionic surfactant (F-177P): | 0.03 g |
| Thermal polymerization inhibitor: | |
| N-Nitrosophenylhydroxylamine aluminum salt: | 0.01 g |
| Pigment dispersion: | 2.4 g |
| Composition of pigment dispersion: | |
| Pigment Blue 15:6: | 15% by weight |
| Allyl methacrylate/methacrylic acid copolymer (copolymerization molar ratio: 83/17): | 10% by weight |
| Cyclohexanone: | 15% by weight |
| Methoxypropyl acetate: | 20% by weight |
| Propylene glycol monomethyl ether: | 40% by weight |
| Methyl ethyl ketone: | 30.0 g |
| Propylene glycol monomethyl ether: | 20.0 g |

(Preparation of Protective Layer)

A 3% by weight aqueous solution of polyvinyl alcohol (degree of hydrolysis: 98% by mole, degree of polymerization: 550) was coated on this photosensitive layer such that a coating weight after drying was 2 g/m$^2$ and then dried at 100° C. for 2 minutes.

(Evaluation of Photosensitivity)

FUJI STEP GUIDE (manufactured by Fuji Photo film Co., Ltd., a gray scale in which a transmitted optical density discontinuously changes at a ΔD of 0.15) was brought into intimate contact with the thus obtained lithographic printing plate precursor, which was then exposed by a xenon lamp through an optical filter (KENKO BP-40) so as to have known exposure energy. For the purpose of estimating the exposure aptitude with short wavelength semiconductor laser, KENKO BP-40 capable of achieving exposure with monochromic light of 400 nm was used as the optical filter. Thereafter, the exposed printing plate precursor was dipped in and developed with a developing solution having the following composition at 25° C. for 10 seconds, and sensitivity (clear sensitivity) was calculated from the maximum step number at which an image was completely removed (Table 1). The clear sensitivity as referred to herein expresses energy necessary at minimum for forming an image. The lower this value, the higher the sensitivity is.

(Evaluation of Storage Stability)

A lithographic printing plate prepared by the construction as enumerated in each of the Examples was evaluated with respect to storage stability by comparing clear sensitivity and coefficient of fluctuation of halftone dots after forced elapsing under the following two conditions.

(i) Exposure and development immediately after completion of coating.
(ii) Exposure and development after storage under a forced storage condition at 60° C. for 10 days.

The "clear sensitivity" as referred to herein is the same as described above. Furthermore, the "coefficient of fluctuation of halftone dots after forced elapsing" as referred to herein shows an average value of differences among reproduced values of half dots at halftone dots of the developed image (as measured by ccDOT, as manufactured by Centurfax) of 20, 30, 40 and 50%, respectively. That is, what this value is high shows that reproducibility of the image in a photographic material without elapsing and a photographic material after forced elapsing is high and is said to be high in storage stability.

(Evaluation of Volume of Substituent)

A total volume of substituents arranged on the 5-membered or 6-membered ring of Z of the formula (I) as enumerated in the following Examples is the total value of volumes of the respective substituents as determined by using the Cache system (Computer Aided Chemistry Ver. 5.5, manufactured by Fujitsu Limited).

The results are shown in Table 1.

TABLE 1

| | Initiation system | | | | | Coefficient of fluctuation halftone dots |
|---|---|---|---|---|---|---|
| | Sensitizing dye (g) | Volume of substituent (Å3) | Titanocene compound (g) | Cosensitizer (g) | Clear sensitivity mJ/cm$^2$ | after forced elapsing (%) |
| Example 1 | D-1 (1.0) | 272 | T-1 (0.90) | Nil | 0.40 | 3.0 |
| Example 2 | D-2 (1.2) | 251 | T-2 (0.12) | H-4 (0.30) | 0.35 | 2.5 |
| Example 3 | D-3 (1.1) | 337 | T-1 (0.10) | H-3 (0.20) | 0.35 | 2.0 |
| Example 4 | D-5 (1.5) | 272 | T-1 (0.95) | H-4 (0.30) | 0.35 | 2.5 |
| Example 5 | D-6 (1.6) | 262 | T-2 (0.08) | H-1 (0.35) | 0.40 | 2.5 |
| Example 6 | D-7 (1.0) | 383 | T-1 (0.11) | H-4 (0.35) | 0.35 | 1.5 |
| Example 7 | D-8 (1.3) | 307 | T-1 (1.50) | H-5 (0.40) | 0.55 | 3.5 |
| Example 8 | D-13 (1.4) | 348 | T-1 (0.12) | H-6 (0.40) | 0.50 | 3.0 |
| Example 9 | D-14 (1.2) | 474 | T-2 (0.08) | H-4 (0.30) | 0.40 | 2.0 |
| Example 10 | D-15 (1.3) | 410 | T-1 (1.50) | H-5 (0.40) | 0.50 | 2.5 |
| Example 11 | D-19 (1.4) | 342 | T-1 (0.12) | H-6 (0.40) | 0.50 | 2.5 |
| Comparative Example 1 | I-1 (1.0) | 141 | T-1 (0.90) | H-4 (0.30) | 0.30 | 7.5 |
| Comparative Example 2 | I-2 (1.0) | 105 | T-1 (0.90) | Nil | 0.35 | 6.5 |
| Comparative Example 3 | I-3 (1.1) | 159 | T-2 (0.12) | H-4 (0.30) | 0.35 | 7.0 |
| Comparative Example 4 | I-4 (1.6) | 108 | T-1 (1.50) | H-5 (0.40) | 0.55 | 6.5 |
| Comparative Example 5 | I-5 (1.2) | 128 | T-2 (0.08) | H-4 (0.30) | 0.40 | 5.5 |
| Comparative Example 6 | I-6 (1.4) | 114 | T-1 (0.12) | H-6 (0.40) | 0.55 | 7.0 |

(I-1)

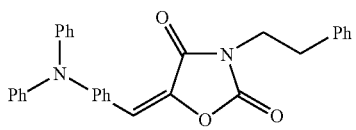

(I-2)

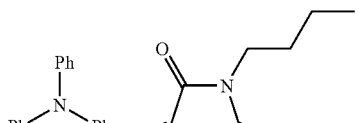

(I-3)

TABLE 1-continued

| | Initiation system | | | | Coefficient of fluctuation halftone dots |
|---|---|---|---|---|---|
| Sensitizing dye (g) | Volume of substituent (Å3) | Titanocene compound (g) | Cosensitizer (g) | Clear sensitivity mJ/cm² | after forced elapsing (%) |

(I-4)

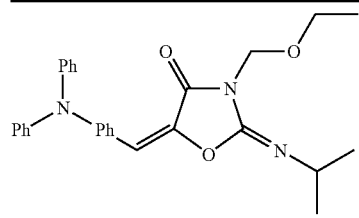

(I-5)

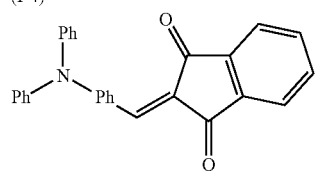

(I-6)

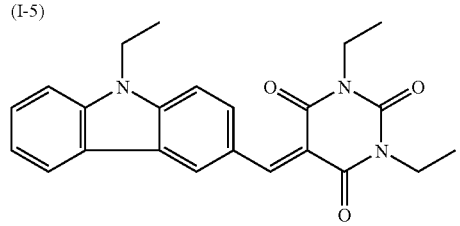

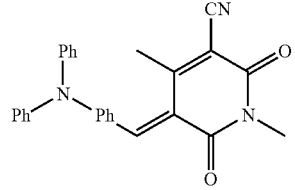

As described above, the lithographic printing plate precursors using the photosensitive composition of the invention have very high sensitivity and exhibit sufficient sensitivity in the scan exposure system. Furthermore, with respect to the storage stability, for example, in Examples 1 and 2, it is noted that the photographic materials using a sensitizing dye having a volume of substituent exceeding 200 Å³ have high sensitivity and a small coefficient of fluctuation of halftone dots and exhibit high storage stability. Also, as shown in Example 6, it is noted that the photographic material using a sensitizing dye having a volume of substituent as high as about 400 Å³ has a very small coefficient of fluctuation of halftone dots and exhibits very high storage stability. However, in Comparative Examples 1, 2 and 3 having a substantially identical skeleton but having a small volume of substituent, it is noted that though the sensitivity is not hindered, the coefficient of fluctuation of halftone dots is very high and the storage stability is poor.

Moreover, the photopolymerization initiation system to be contained in the photosensitive composition of the invention has high sensitivity as compared with the case where the sensitizing dye is not used. In particular, even in the case where the addition amount of the titanocene compound is low, sufficient sensitivity is revealed.

Incidentally, the developing solution as used in the foregoing Examples 1 to 11 and Comparative Examples 1 to 6 is an aqueous solution having a pH of 12.0 and having the following composition.

| | |
|---|---|
| 1K potassium silicate: | 2.4 g |
| Potassium hydroxide: | 0.2 g |
| Compound represented by the following formula (1): | 5.0 g |
| Water: | 91.3 g |
| Tetrasodium ethylenediaminetetraacetate: | 0.1 g |

(1)

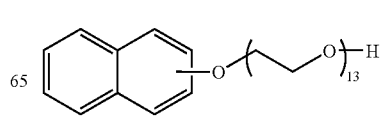

Examples 12 to 19 and Comparative Example 7

A lithographic printing plate precursor was prepared in the following procedures and evaluated for printing performance. The results are shown in Table 2.

(Pre-Treatment of Support)

The surface of an aluminum plate (material quality: 1S) having a thickness of 0.3 mm was sand blasted by using a No. 8 nylon brush and an aqueous suspension of 800-mesh pamiston and then thoroughly washed with water. The resulting aluminum plate was dipped in and etched with 10% by weight sodium hydroxide at 70° C. for 60 seconds, washed with running water, neutralized and washed with 20% by weight nitric acid, and then washed with water. The aluminum plate was subjected to an electrolytic roughing treatment in a quantity of electricity at the time of anode of 300 coulombs/dm$^2$ in a 1% by weight nitric acid aqueous solution using an alternating waveform current of sine wave under a condition at a VA of 12.7 V. A surface roughness thereof was measured and found to be 0.45 µm (in terms of an Ra expression according to JIS B0601).

(Hydrophilic Treatment of Support Surface)

The foregoing support was dipped in an aqueous solution containing 2.5% by weight of No. 3 sodium silicate (SiO$_2$: 28 to 30%, Na$_2$O: 9 to 10%, Fe: not more than 0.02%) having a pH of 11.2 at 70° C. for 13 seconds and subsequently washed with water. A quantity of silicate on the surface as determined from the amount of Si element by fluorescent X ray analysis of the surface was found to be 10 mg/m$^2$.

(Coating of Interlayer)

A coating solution having the following composition (A) was prepared, coated on the surface of the foregoing support which had been subjected to a hydrophilic treatment in a coating amount of phenylphosphonic acid of 20 mg/m$^2$ by using a wheeler at 180 rpm, and then dried at 80° C. for 30 seconds.

| (Coating solution A for interlayer) | |
|---|---|
| Phenylphosphonic acid: | 0.09 to 1.4 g |
| Methanol: | 190 g |

(Coating of Photosensitive Layer)

A photosensitive solution having the following composition was prepared, coated on the foregoing support having an interlayer provided thereon in a coating amount of from 1.0 to 2.0 g/m$^2$ by using a wheeler, and then dried at 100° C. for one minute.

(Photosensitive Solution)

| | |
|---|---|
| Addition polymerizable compound (compound as described in Table 2): | 1.7 g |
| Binder polymer (compound as described in Table 2): | 2.2 g |
| Sensitizing dye (compound as described in Table 2) | 0.2 g |
| Activator (compound as described in Table 2) | 0.1 g |
| Cosensitizer (H-4): | 0.35 g |
| Coloring pigment dispersion | 2.3 g |

(Composition of Pigment Dispersion)

| | |
|---|---|
| Pigment Blue 15:6 | 15% by weight |
| Allyl methacrylate/methacrylic acid copolymer (copolymerization ratio: 83/17), as thermally polymerized: | 10% by weight |
| Cyclohexanone: | 15% by weight |
| Methoxypropyl acetate: | 20% by weight |
| Propylene glycol monomethyl ether: | 40% by weight |
| Thermal polymerization inhibitor (N-nitrosophenylhydroxylamine aluminum salt): | 0.01 g |
| Surfactant (MEGAFAC F-177, manufactured by Dainippon Ink and Chemicals, Incorporated): | 0.02 g |
| Methyl ethyl ketone: | 30.0 g |
| Propylene glycol monomethyl ether: | 20.0 g |

(Coating of Protective Layer)

A 3% by weight aqueous solution of polyvinyl alcohol (degree of hydrolysis: 98% by mole, degree of polymerization: 550) was coated on this photosensitive layer such that a coating weight after drying was 2 g/m$^2$ and then dried at 100° C. for 2 minutes.

(Exposure of Lithographic Printing Plate Precursor)

The thus obtained lithographic printing plate precursor was subjected to solid image exposure and halftone dot image exposure with 175 lines/inch from 1 to 99% at an interval of 1% by using monochromic light of 400 nm as a light source while adjusting an exposure power such that an exposure energy density on the plate surface became 200 µJ/cm$^2$.

(Development/Plate Making)

A prescribed developing solution (as described in Table 2) and a finisher FP-2W, manufactured by Fuji Photo Film Co., Ltd. were charged in an automatic processor LP-850, manufactured by Fuji Photo Film Co., Ltd., and the exposed plate was subjected to development and plate making under a condition at a temperature of the developing solution of 30° C. for a development time of 18 seconds, thereby obtaining a lithographic printing plate.

The resulting lithographic printing plate was measured for clear sensitivity and coefficient of fluctuation of halftone dots after forced elapsing in the same manner as in Example 1. Moreover, the printing resistance was evaluated in the following manner.

(Printing Resistance Test)

Roland's R201 was used as a printing machine, and GEOS-G(N), manufactured by Dainippon Ink and Chemicals, Incorporated was used as an ink. A printed matter in a solid image area was observed, and the printing resistance was examined by the number of sheets at which the image started to become faint. The larger the numerical value, the better the printing resistance is.

TABLE 2

| No. | Photosensitive layer | | | | | Coating amount (mg/m²) | Composition of developing solution | Printing performance | | |
|---|---|---|---|---|---|---|---|---|---|---|
| | Addition polymerizable compound | Binder polymer | Sensitizing dye | Volume of substituent (Å³) | Activator compound | | | Printing resistance of image area (sheets) | Clear sensitivity | Coefficient of fluctuation of halftone dots after forced elapsing |
| Example 12 | M-1 | B-1 | D-1 | 272 | T-1 | 1.4 | DV-3 | 90,000 | 0.35 | 3.0 |
| Example 13 | M-2 | B-2 | D-2 | 251 | T-2 | 1.6 | DV-2 | 95,000 | 0.35 | 2.5 |
| Example 14 | M-1 | B-3 | D-3 | 337 | T-1 | 1.4 | DV-2 | 110,000 | 0.30 | 2.5 |
| Example 15 | M-1 | B-3 | D-7 | 383 | T-1 | 1.3 | DV-1 | 105,000 | 0.35 | 1.5 |
| Example 16 | M-2 | B-1 | D-8 | 307 | T-2 | 1.6 | DV-2 | 70,000 | 0.50 | 3.5 |
| Example 17 | M-2 | B-3 | D-13 | 348 | T-2 | 1.2 | DV-2 | 80,000 | 0.50 | 3.0 |
| Example 18 | M-1 | B-2 | D-15 | 410 | T-1 | 1.2 | DV-2 | 80,000 | 0.55 | 2.5 |
| Example 19 | M-1 | B-3 | D-19 | 342 | T-2 | 1.4 | DV-3 | 60,000 | 0.55 | 3.0 |
| Comparative Example 7 | M-1 | B-3 | I-2 | 105 | T-1 | 1.3 | DV-2 | 95,000 | 0.33 | 7.0 |

(Addition Polymerizable Compound in Table 2)

[M-1]

3-(2-Methylprop-2-enoyloxy)-2-(N-(6-((2-methylprop-2-enoyloxy)-1-((2-methylprop-2-enoyloxy)methyl)ethoxy)carbonylamino)hexyl)-carbamoyloxy)propyl-2-methylprop-2-enoate (U-4H)

[M-2]

Pentaerythritol tetraacrylate (NK ESTER A-TMMT, manufactured by Shin-Nakamura Chemical Co., Ltd.)

(Binder polymer in Table 2)

[B-1]

Allyl methacrylate/methacrylic acid/N-isopropyl acrylamide copolymer (copolymerization molar ratio: 60/12/28)

Measured acid value as determined by NaOH titration: 1.07 meq/g

Weight average molecular weight as determined by GPC measurement: 140,000

[B-2]

Allyl methacrylate/methacrylic acid copolymer (copolymerization molar ratio: 83/17)

Measured acid value as determined by NaOH titration: 1.55 meq/g

Weight average molecular weight as determined by GPC measurement: 125,000

[B-3]

Polyurethane resin as a polycondensate of the following diisocyanates and diols:

4,4'-Diphenylmethane diisocyanate (MDI)

Hexamethylene diisocyanate (HMDI)

Polypropylene glycol, weight average molecular weight: 1,000 (PPG1000)

2,2-Bis(hydroxymethyl)propionic acid (DMPA)

Tetraethylene glycol (TEG)

Copolymerization ratio (MDI/HMDI/PPG1000/DMPA/TEG)=38/12/15/25/10

Measured acid value as determined by NaOH titration: 1.08 meq/g

Weight average molecular weight as determined by GPC measurement: 52,000

(Developing Solution in Table 2)

DV-1

Aqueous solution having a pH of 10 and having the following composition:

| | |
|---|---|
| Monoethanolamine: | 0.1% by weight |
| Triethanolamine: | 1.5% by weight |
| Following compound (2): | 4.0% by weight |
| Following compound (3): | 2.5% by weight |
| Following compound (4): | 0.2% by weight |
| Water: | 91.7% by weight |

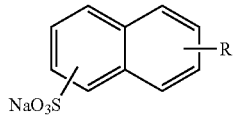

(2)

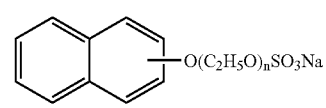

(3)

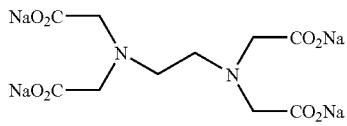

(4)

DV-2

Aqueous solution having a pH of 12 and having the following composition:

| | |
|---|---|
| Potassium hydroxide: | 0.2 g |
| 1K potassium silicate: | 2.4 g |
| Compound represented by the foregoing formula (1): | 5.0 g |
| Tetraethylediamine tetrasodium salt: | 0.1 g |
| Water: | 91.3 g |

DV-3

Aqueous solution having a pH of 13 and having the following composition:

| | |
|---|---|
| 1K potassium silicate: | 3.0% by weight |
| Potassium hydroxide: | 1.5% by weight |
| Compound represented by the foregoing formula (3): | 0.2% by weight |
| Water: | 95.3% by weight |

As is clear from Table 2, the lithographic printing plate precursors using the photosensitive composition of the invention provide lithographic printing plates having excellent storage stability under conditions under which plate making can be carried out with high producibility by scan exposure, namely under exposure conditions with very low energy. On the other hand, in Comparative Example 7 which does not use the photopolymerization initiation system, since the fluctuation value of halftone dots is large so that the storage is instable, a practically useful lithographic printing plate was not obtained.

Incidentally, the structures of the sensitizing dyes in the Examples are those enumerated in the present specification, and the structures of other compounds are as follows.

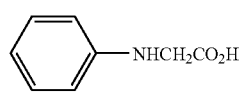
(H1)

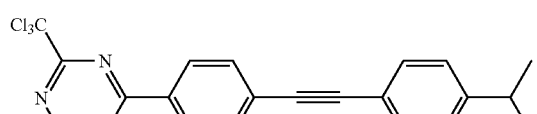
(H3)

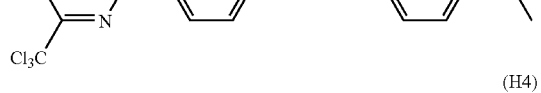
(H4)

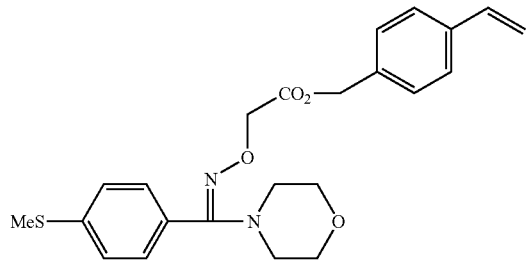
(H5)

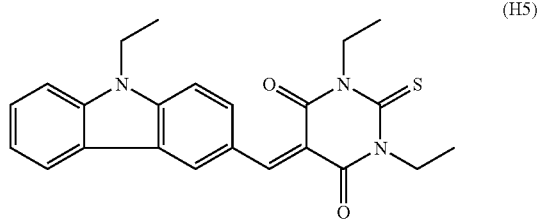
(H6)

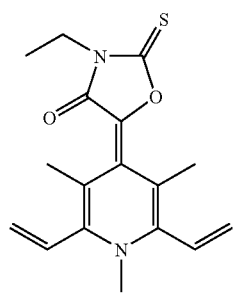

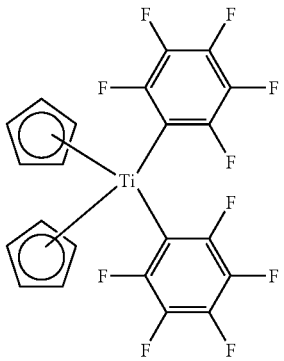
(T-1)

-continued

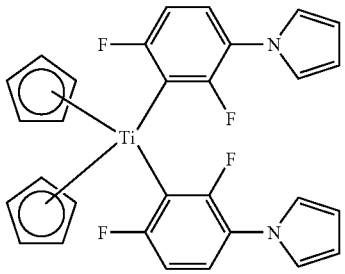
(T-2)

This application is based on Japanese Patent application JP 2004-199101, filed Jul. 6, 2004, the entire content of which is hereby incorporated by reference, the same as if set forth at length.

What is claimed is:

1. A photosensitive composition comprising:
a sensitizing dye which is represented by the following formula (VIII):

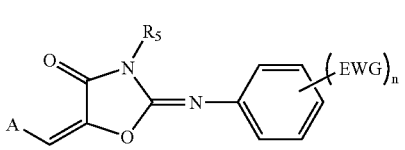
(VIII)

wherein $R_5$ represents a hydrogen atom, or a substituted or unsubstituted alkyl group; EWG represents a halogen atom, an ester group, an amide group, a nitro group, a cyano group, a sulfonic group, and a carbonyl group; n represents an integer from 0 to 3; A represents a substituted or unsubstituted aromatic ring or hetero ring; and the total volume of $R_5$ and the imino substituent segment of formula (VIII) are each independently 200 $Å^3$ or more;

an activator compound being capable of causing a chemical change due to a mutual action with an electron excited state to be generated by light absorption of the sensitizing dye, thereby generating a radical or an acid; and a polymerizable compound being capable of reacting with at least one of a radical and an acid.

2. The photosensitive composition according to claim 1, wherein the polymerizable compound is an addition polymerizable compound having at least one ethylenically unsaturated double bond.

3. The photosensitive composition according to claim 1, wherein the activator compound is at least one compound selected from the group consisting of titanocene compounds, hexaaryl biimidazoles, and triazine compounds.

4. The photosensitive composition according to claim 1, wherein the activator compound is a titanocene compound.

5. A lithographic printing plate precursor which comprises a support and a photosensitive layer containing the photosensitive composition according to claim 1.

6. The lithographic printing plate precursor according to claim 5, wherein the photosensitive layer further contains a binder polymer.

7. The lithographic printing plate precursor according to claim 5, wherein the photosensitive layer contains the sensitizing dye in an amount of from 0.05 to 30 parts by weight based on 100 parts by weight of the photosensitive layer.

8. An image recording method comprising scan exposing an image recording material comprising a support and a photosensitive layer containing the photosensitive composition according to claim 1 with a laser light source of from 350 to 450 nm.

9. The photosensitive composition according to claim 1, wherein EWG in the formula (VIII) is an ester group.

* * * * *